United States Patent [19]

Ohta et al.

[11] Patent Number: 5,641,997

[45] Date of Patent: Jun. 24, 1997

[54] PLASTIC-ENCAPSULATED SEMICONDUCTOR DEVICE

[75] Inventors: Hideo Ohta, Tokyo; Tetsuo Okuyama, Yokohama; Shinetsu Fujieda, Kawasaki; Sadao Kajiura, Kanagawa-ken; Akira Yoshizumi, Yokohama, all of Japan

[73] Assignee: Kabushiki Kaisha Toshiba, Kanagawa-ken, Japan

[21] Appl. No.: 305,478

[22] Filed: Sep. 13, 1994

[30] Foreign Application Priority Data

Sep. 14, 1993 [JP] Japan .................... 5-229064
Dec. 27, 1993 [JP] Japan .................... 5-329199
May 6, 1994 [JP] Japan .................... 6-094442

[51] Int. Cl.⁶ ........................................ H01L 23/29
[52] U.S. Cl. .................. 257/788; 257/789; 257/790; 257/795
[58] Field of Search ........................ 257/790, 789, 257/788, 787, 795

[56] References Cited

U.S. PATENT DOCUMENTS 4,680,617  7/1987  Ross ............................ 357/72
4,788,583  11/1988  Kawahara et al. ............. 257/790

FOREIGN PATENT DOCUMENTS 2-065165  3/1990  Japan .
2-178953  7/1990  Japan .
3-171654  7/1991  Japan ............................ 257/795

*Primary Examiner*—Sara W. Crane
*Assistant Examiner*—Roy Potter
*Attorney, Agent, or Firm*—Finnegan, Henderson, Farabow, Garrett & Dunner, L.L.P.

[57] ABSTRACT

A semiconductor chip is positioned between encapsulating sheets. The encapsulating sheets each have a surface that is highly adhesive and a surface that is less adhesive. The surface of the encapsulating sheet that is highly adhesive contacts the chip. The surface that is less adhesive contacts a mold. Subsequently, encapsulation is carried out by molding. A soldering resistance can be improved without reducing a mold releasing property.

20 Claims, 8 Drawing Sheets

PLASTIC-ENCAPSULATED SEMICONDUCTOR DEVICE

BACKGROUND OF THE INVENTION

1. Field of the Invention

The present invention relates to a plastic-encapsulated semiconductor device.

2. Description of the Related Art

As the integration level of semiconductor devices increases, the packages forming the semiconductor devices become undesirably larger. Because these packages are encapsulated, a thinner encapsulation is desirable in order to reduce mounting space.

The recent semiconductor devices, such as ASIC (Application specific integrated circuits), generate a large amount of heat during operation because of their high integration level and high operation speed. Therefore, the latest semiconductor devices require a new resin encapsulant having a high thermal conductivity for easy heat dissipation.

Resin-encapsulated semiconductor devices greatly vary in package type and the size of the production lots for each package type is limited. Therefore, a suitable resin encapsulation for various types of semiconductor devices is required that is economical for small production lots.

Conventional resin-encapsulated semiconductor devices are encapsulated by a transfer molding process. Since the transfer molding process requires batch processing, it is difficult to carry out encapsulation by in-line processing. Therefore, the transfer molding process is not suitable for manufacturing various types of semiconductor devices in small lots.

Japanese patent disclosure KOKAI 2-257662 and U.S. Pat. application Ser. No. 40,532 filed on Mar. 30, 1993 disclose an improved method, which meets the above requirements, using a resin sheet. In the method, a resin sheet is disposed on a semiconductor chip and then it is pressed and heated by a mold. This method is applicable for in-line processing. Further, a thinner encapsulation can be achieved using the disclosed method.

However, some problems still remain. In general, it is desirable to add certain additives to the resin sheet so as to improve a particular property of the encapsulant. However, there are some properties that are advantageous in one aspect, but disadvantageous in another. Moreover, some additives have additional properties that are disadvantageous. As a result, it is difficult to obtain the advantageous properties of an additive without also obtaining the disadvantageous properties.

For example, a mold releasing agent may be added to the resin sheet in order to prevent a residual flash of the cured resin from remaining on an encapsulant. However, the addition of the mold releasing agent reduces the adhesion strength of the encapsulant to the semiconductor chip on which the encapsulation is formed. The reduction of the adhesion strength causes a poor moisture resistance because of the increased probability of cracking between the chip and the resin.

A method has been proposed in Japanese patent disclosure KOKAI 2-257662, which uses a laminated sheet. The laminated sheet includes an uncured resin sheet and a sheet, such as metal, ceramic or cured resin, that does not melt in molding processing. Therefore, this eliminates the problem of releasing the resin from the mold. However, since different sheets tend to delaminate, reliability is sacrificed. In U.S. Pat. No. 4,680,617, a lamination of a prepreg and a glass-fiber layer is described. However, this laminated sheet does not release well from the mold.

An inorganic filler having high thermal conductivity is usually added to a resin to improve heat dissipation. However, the addition of the filler increases the viscosity of the resin. Therefore, a resin containing a large amount of the fillers for high thermal conductivity is too viscous for molding. Further, the addition of a large amount of the fillers damages the semiconductor chip and bonding wires.

An idea has been proposed in Japanese patent disclosure KOKAI 5-175264, which uses a sheet including a low-stress low-viscous resin on an active surface of a semiconductor chip, and a high-thermal-conductivity high-viscous strong resin on the opposite surface of the chip. However, Japanese patent disclosure KOKAI 5-175264 does not describe how to realize such a sheet. However, since different resins tend to delaminate, reliability is low.

Another additive having both advantageous and disadvantageous properties is a curing accelerator. The curing accelerator can improve productivity. However, the addition of a large amount of the accelerator causes residual amounts of the accelerator to remain in the resin. The residual accelerators corrode metal lines of the semiconductor chip. Also, flame retardant additives have the same tendency.

As above-mentioned, there are many properties of a resin or requirements for encapsulation. However, since each of additives for some property may be harmful against other properties, both of conflicting properties can not be improved.

SUMMARY OF THE INVENTION

An object of the present invention is to provide a plastic-encapsulated semiconductor device and a method of manufacturing the same, which is improved in both of conflicting properties caused by additives, such as mold releasing and adhesion, thermal conductivity and strength, thermal conductivity and harmlessness to a surface of a semiconductor chip, reliability and productivity, reliability and flame retardance, and the like.

Another object of the present invention is to provide a plastic-encapsulated semiconductor device and a method of the same using a resin sheet, which is improved in reliability or productivity.

Another object of the present invention is to provide a resin sheet used in a method of a plastic-encapsulated semiconductor device which is improved in reliability or productivity.

These and other objects of the present invention can be achieved by providing a method for producing a plastic-encapsulated semiconductor device comprising of the steps of:

placing an encapsulating sheet on a semiconductor chip, wherein the encapsulating sheet is comprised of an uncured resin sheet, and a distribution of an additive in a resin composition of the resin sheet is different between a surface of the encapsulating sheet contacting the semiconductor chip and an opposite surface so as to improve a property which is improved when the additive exists at the one surface without deteriorating a property which is deteriorated when the additive exists at the opposite surface; and curing the encapsulating sheet.

The present invention also provides a method for producing a plastic-encapsulated semiconductor device comprising of the steps of:

placing an encapsulating sheet on a semiconductor chip, wherein the encapsulating sheet is comprised of an uncured resin sheet, and a distribution of an additive in a resin composition of the resin sheet is different between one region of the encapsulating sheet contacting a lead connected to the semiconductor chip and another region so as to improve a property which is improved when the additive exists at the one region without deteriorating a property which is deteriorated when the additive exists at the other region; and curing the encapsulating sheet.

The present invention further provides a method for producing a plastic-encapsulated semiconductor device comprising of the steps of:

placing an encapsulating sheet on a semiconductor chip including an EPROM, wherein the encapsulating sheet is comprised of an uncured resin sheet, and a distribution of an additive of a colorant in a resin composition of the resin sheet is different between one region of the encapsulating sheet contacting the semiconductor chip and another region so as to transmit erasing light through the one region; and curing the encapsulating sheet.

The present invention further provides a method for producing a plastic-encapsulated semiconductor device comprising of the steps of:

placing an encapsulating sheet on a semiconductor chip, wherein the encapsulating sheet is comprised of an uncured resin sheet, and an adhesiveness of one surface of the encapsulating sheet which is contacting to the semiconductor chip is higher than that of an opposite surface of the encapsulating sheet contacting a mold; and molding and curing the encapsulating sheet.

The present invention also provides a plastic-encapsulated semiconductor devices produced by a method comprising of the steps of:

placing an encapsulating sheet on a semiconductor chip, wherein the encapsulating sheet is comprised of an uncured resin sheet, and a distribution of an additive in a resin composition of the resin sheet is different between one surface of the encapsulating sheet contacting to the semiconductor chip and an opposite surface of the encapsulating sheet so as to improve a property which is improved when the additive exists at the one surface without deteriorating a property which is deteriorated when the additive exists at the opposite surface; and curing the encapsulating sheet.

The present invention further provides a plastic-encapsulated semiconductor device comprising:

a resin-encapsulating layer composed of resin layers having different distribution of an additive in resin compositions of the resin layers so as to improve a property which is improved when the additive exists in the resin layer of a chip side without deteriorating a property which is deteriorated when the additive exists at an outer surface of the device, wherein the additive comprises at least one of a curing accelerator, a colorant, a mold releasing agent, an adhesion imparting agent, a flame retardant, and a filler; and a semiconductor chip encapsulated in the resin-encapsulating layer.

The present invention also provides a plastic-encapsulated semiconductor device comprising:

a semiconductor chip; and a resin-encapsulating layer composed of a first resin-encapsulating layer formed on an upper side of the semiconductor chip and a second resin-encapsulating layer formed on a lower side of the semiconductor chip, the first and second resin-encapsulating layers having different distribution of an additive in a resin composition, wherein the distributions are changed so that the following relation is satisfied:

$$\{(L'-L)/L\} < 0.06$$

where

L: thickness of the semiconductor device; and

L': the maximum height of the semiconductor device measured from a flat surface.

The present invention also provides a plastic-encapsulated semiconductor device comprising:

a semiconductor chip; and a resin-encapsulating layer composed of a first resin-encapsulating layer formed on an upper side of the semiconductor chip and a second resin-encapsulating layer formed on a lower side of the semiconductor chip, having different distribution of an additive in a resin composition, wherein the distributions are changed so that the following relation is satisfied:

$$0.8 < (abc)/(def) < 1.2$$

where a: coefficient of thermal expansion of the first resin-encapsulating layer;

b: elastic modulas of the first resin-encapsulating layer;

c: thickness of the first resin-encapsulating layer;

d: coefficient of thermal expansion of the second resin-encapsulating layer;

e: elastic modulas of the second resin-encapsulating layer; and f: thickness of the second resin-encapsulating layer.

For example, the thickness, resin or distribution of additives in the 1st and 2nd resin-encapsulating layer is changed so as to satisfy the above relations.

The present invention further provides an encapsulating sheet for encapsulating a semiconductor chip when placed on the semiconductor chip, and cured the encapsulating, comprising: an uncured resin sheet wherein a distribution of an additive in a resin composition of the resin sheet is different between one surface of the encapsulating sheet contacting the semiconductor chip and an opposite surface and the additive comprises at least one of a curing accelerator, a colorant, a mold releasing agent, an adhesion imparting agent, a flame retardant, and a filler.

DETAILED DESCRIPTION OF THE PREFERRED EMBODIMENTS

Figure 1:
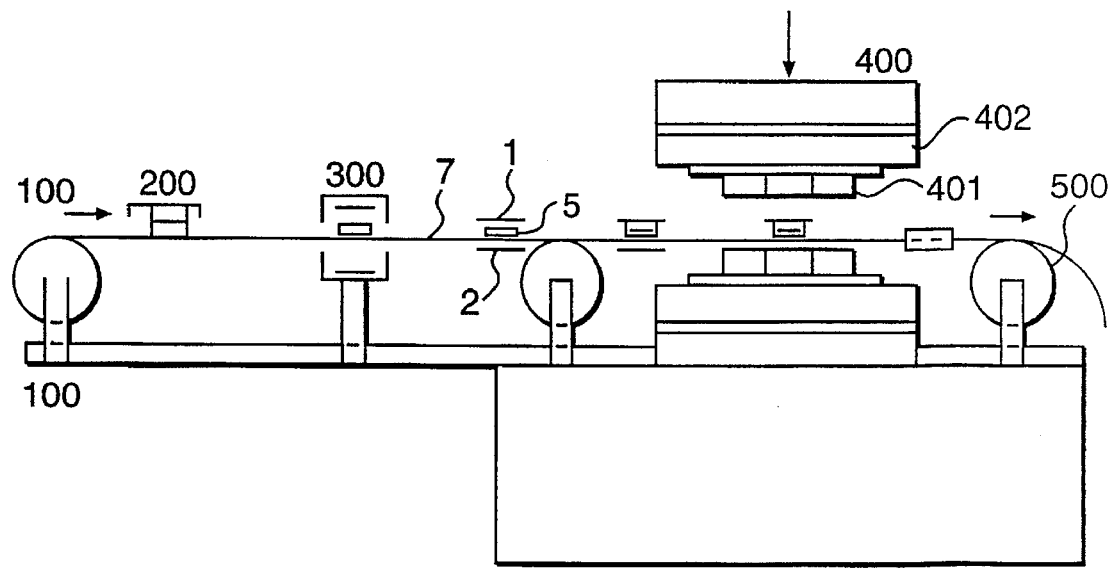
FIG. 1 is a schematic view of an apparatus for producing an embodiment of the present invention.

Referring now to the drawings, the embodiments of the present invention will be described below.

The method of the present invention uses an uncured resin sheet in which a distribution of additives is not uniform. For example, the concentration of an additive is high at a region where the additive is required for the property to be improved by the additive; and at other region, the concentration is low. Needless to say, the additive can exist at the required region only. This can not be obtained by transfer molding. In this specification, "distribution" means at least one of "concentration" and "kind".

For example, a first resin sheet is made of a resin composition including an uncured resin and an additive, and a second resin sheet is made of a resin composition including the same uncured resin and a different additive. The first resin sheet and the second resin sheet are laminated so as to make an encapsulating sheet. Also, the encapsulating sheet may include resin sheets having a different concentration of an additive. In the present invention, the encapsulating sheet is disposed on a semiconductor chip and thereafter the sheet is melted and cured. In melting, the first and second resin sheet are fused at the boundary of these sheets. Therefore, the probability that the sheets will delaminate can be reduced. The resins of the first resin sheet and the second resin sheet are not required to be completely the same. It is only required that the resins of the first and the second resin sheets can melt and fuse together. Also, the difference in the distribution of additives may exist between a region on a surface and another region on the surface. The difference may be step-wise or continuous. Further, a semiconductor chip may be positioned between an encapsulating sheet of the first resin sheet and an encapsulating sheet of the second resin sheet. In other words, the resin composition of an active surface of the semiconductor chip, where an active element such as a transistor is formed, can be different from that of a bottom surface of the chip. In this case, the distribution of an additive is different between the active surface side and the bottom surface side, however the distribution of an additive can be uniform in each encapsulating sheet.

An apparatus, the process for producing a resin-encapsulated semiconductor device is illustrated in FIG. 1. This apparatus includes a supply reel 100, a semiconductor chip mounting station 200, a sheet bonding station 300 at which two encapsulating sheets are supplied from above and below, a press-molding station 400, and a take-up reel 500. Encapsulation is carried out while a film carrier 7 is moved from supply reel 100 to take-up reel 500. An outer lead, such as a film carrier, on which a semiconductor chip is mounted may be supplied by a reel and also the encapsulating sheet maybe supplied by a reel. If both are supplied by a reel, it is possible to carry out continuously the steps from assembling to encapsulation.

First, mounting station 200 bonds a semiconductor chip 5 to film carrier 7 by face down bonding or wire bonding. After that, bonding station 300 bonds encapsulating sheets 1,2 to the upper and lower sides of chip 5. It is preferable that sheets 1,2 are supplied in a cut form so as to make a good shape and to ensure good adhesion. At press-molding station 400, a mold 401, which is heated by a heater 402, compresses and molds sheets 1,2. Film carrier 7 is finally taken up by take-up reel 500. Although in this apparatus, encapsulating sheets 1,2 are used, the encapsulating sheet on at least an active surface of chip 5 is preferred. The encapsulating sheet on the opposite surface is not required to be made of uncured resin. Further, the encapsulating sheet on the opposite surface can be omitted. Furthermore, if another heating element is provided, the mold may not be necessary.

Sheet bonding station 300 can be provided with a container to hold a pile of sealing sheets 1,2 and a chip position detector to automatically detect the position of the chip. It moves vertically and laterally to automatically supply the sheets 1,2. Sheet bonding station 300 may also be provided with an element to preheat either of chip 5 or sheets 1,2. As a result, the sheets 1,2 become soft so that it may be easy for the sheets to be bonded with the chip. The heating may be accomplished by irradiation with infrared rays or an oven. If the heating is accomplished by irradiation with light, the preheating element is preferably provided with a condenser lens.

Figure 2A:
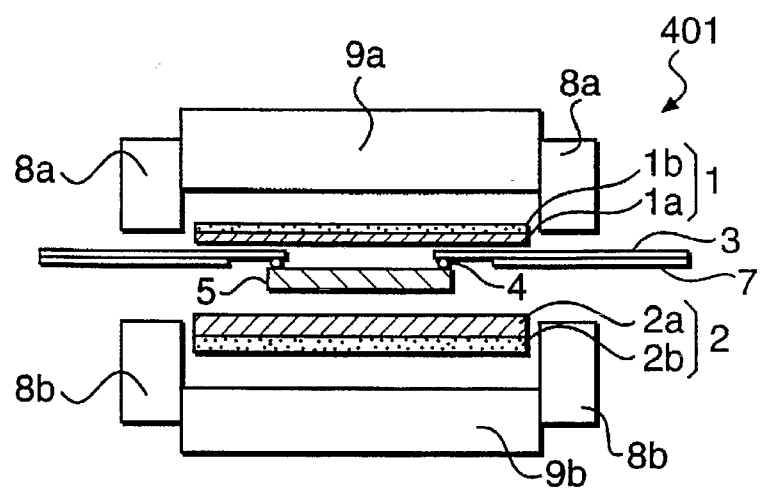
FIGS. 2(a)–2(c) are a schematic view of an apparatus in progressive stages for producing an embodiment of the present invention.
Figure 2B:
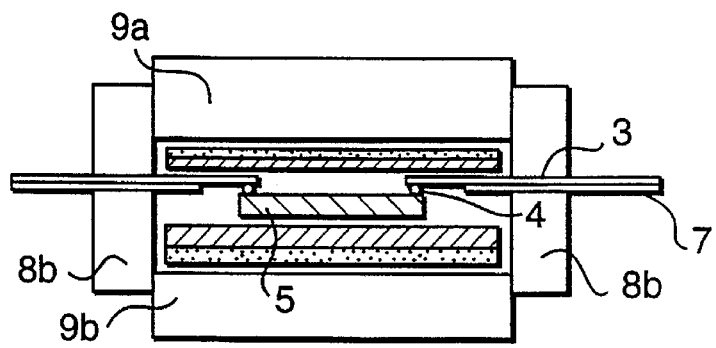
Figure 2C:
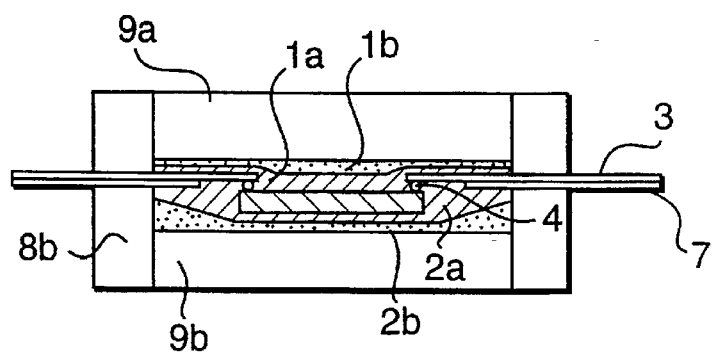
Figure 2D:
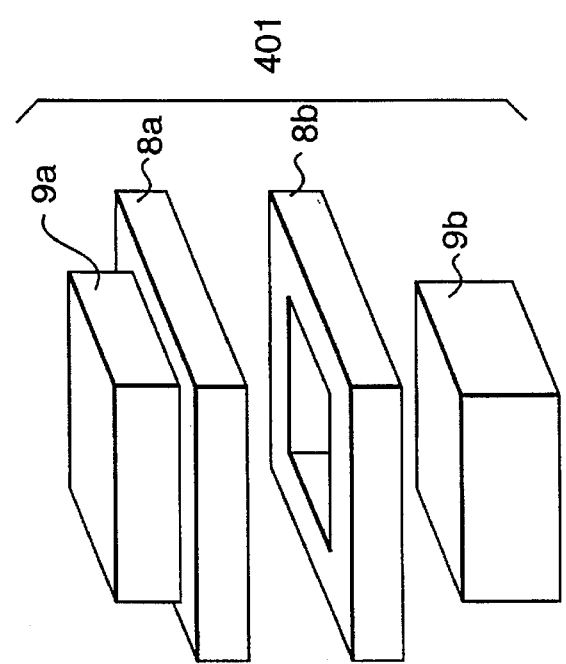
FIG. 2(d) is an exploded perspective view of mold components shown in FIGS. 2(a)–2(c)

FIGS. 2(a) and 2(d) shows an example of press-molding station 400. Semiconductor chip 5, which is covered by encapsulating sheets 1,2, is placed in mold 401 as shown in FIG. 2(a). Sheet 1 includes a first resin sheet 1a and a second resin sheet 1b, and sheet 2 also includes a first resin sheet 2a and a second resin sheet 2b. The concentration of an additive may be different between the first and the second resin sheets. After semiconductor chip 5 is placed in mold 401, carrier 7, which may be a lead frame, is clamped by outermolds 8a, 8b, as shown in FIG. 2(b). Finally, sheets 1,2 are compression-molded by inner molds 9a,9b and cured under pressure, as shown in FIG. 2(c). FIG. 2(d) shows a perspective view of the mold.

The curing may be accomplished by heating the mold or by heating the sheet with an induction heater in the case that the resin included in the sheet is a thermosetting resin. Further, a post-curing heat treatment is effective to improve properties of the cured resin. However, in the case that the resin is a photo-curable resin, the curing may be accomplished by irradiating light, such as UV rays.

The shape of the mold 401 is preferably equal to or slightly larger than that of an encapsulating sheet. Further, the volume of the mold is preferably slightly smaller than that of the encapsulating sheet, so that the encapsulating sheet is adequately pressed at the molding. The mold may be provided with an air vent to release excess resin during pressing. Moreover, the mold may be constructed such that the inside of the mold can be evacuated so as to avoid the occurrence of voids at the compression-molding. Further, the mold may be composed of two hollow molds facing each other or a combination of a frame-like mold and a pressing mold. The molding permits encapsulation to be performed as an in-line step. Therefore, the above-mentioned process is suitable for a small lot.

The mold may be made of metal, ceramic, heat-resistant plastic, or glass. In the case where a photo-curable resin is employed, the mold is preferably made of a transparent material, such as silica glass, so that the resin can be irradiated with light through the mold.

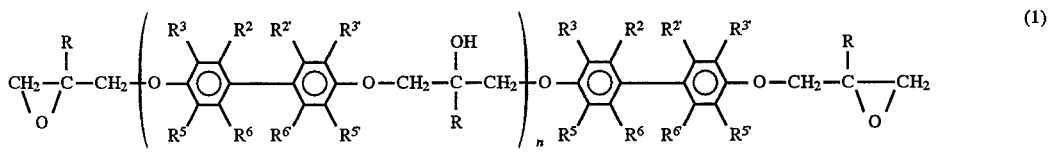

The kind of semiconductor devices is not restricted to the TAB (tape automated bonding) type, but may be a wire bonding type. The present invention is suitable for surface-mounted, thin and large semiconductor devices. The external lead structure is not limited to a film carrier type, but may be a lead frame type, or a circuit board having external terminals.

The resin composition which composes the encapsulating sheet will be described below. Thermosetting resins, photo-curable resins, or engineering plastics can be used as a principal component of the encapsulating sheet. A thermosetting resin may include an epoxy resin, a polyimide resin, a maleimide resin, a silicone resin, a phenol resin, a polyurethane resin, or an acryl resin. They may be used alone or in combination with another.

where R denotes H or $CH_3$ and each of $R^2, R^3, R^5, R^6, R^{2'}$, $R^{3'}, R^{5'}$ and $R^{6'}$ denotes H, Cl, Br or an organic group. such as methyl, ethyl, isopropyl, buthyl or phenyl; and "n" is an integer, such as 0 to 5.

The epoxy resins represented by the formula (1 ) include bis(2,3-epoxypropoxy)biphenyl, 4,4'-bis(2,3-epoxypropoxy)-3,3' 5,5'-tetra-methyl-biphenyl, 4,4'-bis(2,3-epoxypropoxy)-3,3'-5,5'-tetramethyl-2-chlorobiphenyl, 4,4'-bis(2,3-epoxypropoxy)-3,3'-5,5'-tetramethyl-2-bromobiphenyl, 4,4'-bis(2,3-epoxypropoxy)-3,3'-5,5'-tetraethylbiphenyl, 4,4'-bis(2,3-epoxypropoxy)-3,3'-5,5'-tetrabutylbiphenyl, and 4,4'-bis(2,3-epoxypropoxy)-3,3-5, 5'-tetyra-phenylbiphenyl.

In terms of adhesion, a bisphenol A novolak epoxy resin or a bisphenol F novolak epoxy resin is preferable.

In terms of cracking resistance, the epoxy resin represented by the following formula (2) is preferable.

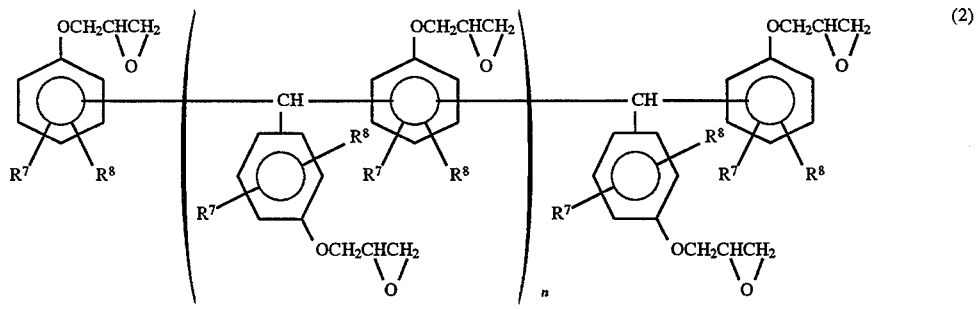

An epoxy resin is preferable because of its good adhesion to a semiconductor chip. A resin may be epoxy resin as long as the resin has two or more epoxy groups in one molecule. An epoxy resin having an epoxy equivalent weight of 250 or less is preferred in terms of a heat resistance. Examples of such an epoxy resin are a phenol-novolak epoxy resin, a cresol-novolak epoxy resin, a naphthol-novolak epoxy resin, a bisphenol A novolak epoxy resin, a glycidyl ester epoxy resin, glicidyl amine epoxy resin, a linear aliphatic epoxy resin, an alicyclic epoxy resin, a heterocyclic epoxy resin, a halogenated epoxy resin, a tris(hydroxy-phenyl)alkane-based epoxy resin obtained by epoxydizing a condensate of a hydroxybenzaldehyde and a phenol or an alkylphenol, a tetra(hydroxyphenyl)alkane epoxide, a 2,2',4,4'-tetraglycidoxy-benzophenone, a triglycidylether of paraaminophenoi, a polyallyl-glycidylether, a 1,3,5-glycidyletherbenzene and 2,2',4,4'-tetra-glycidoxybiphenyl. These epoxy resins are used alone or in a combination of two or more thereof. In terms of flame resistance, a halogenated epoxy resin, such as a bromized epoxy resin is preferable. Examples of the bromized epoxy resins are a bromized bisphenol epoxy resin or a bromized phenol-novolak epoxy resin. In terms of adhesion and thermal shock resistance, an epoxy resin represented by the following formula (1) is preferable.

where each of $R^7$ and $R^8$ denotes H or an organic group such as alkyl group having 1 to 20 carbon atoms; and "n" is an integer, such as 0 to 10

For example, the resin represented by the formula (2) includes "EPPN502" (from Nippon Kayaku Co. Ltd., having a softening point of 70° C. and an epoxy equivalent of 170), "YL-932H"to (from YuKa Shell Co., Ltd.,having a softening point of 63° C. and an epoxy equivalent of 171), "ESX-221"(from Sumitomo Chemical Co., Ltd., having a softening point of 85° C. and an epoxy equivalent of 210) .

A curing agent is generally used for an epoxy resin so that the epoxy resin is cured with the curing agent. A curing agent for an epoxy resin is not particularly limited. The curing agents may include a phenol resin, an organic anhydride or amine. For example, a novolak phenol resin having two or more phenolichydroxyl groups includes such as a phenol novolak resin or a cresol novolak resin, a phthalic anhydride, a hexahydrophtalic anhydride, a tetrahydrophtalic anhydride, a triethylentetraamine, and a metaphenylenediamine.

A photo-curable resin includes a polyester acrylate, an epoxy acrylate, a polyurethane acrylate, a polyether acrylate, an oligoacrylate, an alkyd acrylate, and a polyol acrylate. An initiator of the photo-curable resin may include an acetophenone, a benzophenone, a Michler's ketone, a benzyl, a benzoin, a benzoyl alkyl ether, a benzyl methyl ketat, a tetramethylthiumram monosulfide, a thioxanthones, and an azo compounds.

An engineering plastic includes a polyacetal, a polycarbonate. a polyamide such as "nylon 6" and "nylon 66", a fluoromacromolecule such as an ethylenetetrafluoroethylene copolymer and a polytetrafluoroethylene, and a polyoxybenzoyl.

In general, a resin composition used to encapsulate includes an additive. In the present invention also, an additive is included. The additive may include a filler, a mold releasing agent, a curing accelerator, a flame retardant, a colorant, and the like.

The filler may include an inorganic particle having a high thermal conductivity, such as a quartz glass, a fused silica, a crystalline silica, a glass, a talc, a calcium silicate, a calcium carbonate, a barium sulfate, a magnesia, an alumina, a beryllia, an aluminumnitride, a boronoxide, a silicon nitride, a mica, a metal, a metal powder surface-treated for oxidation protection such as aluminum, copper, and alloys thereof. They may take any shape, such as irregular as crushed, irregular with rounded edges, spherical, near spherical, fibrous, flaky, or flat. Moreover, a coated powder with the same or different crystals are included. These fillers may be used alone or in combination with another.

The mold releasing agent can assist in demolding. It may be effective to coat an encapsulating sheet and/or a mold with the releasing agent in addition to including the mold releasing agent in the resin composition. The mold releasing agent may include a hydrocarbon wax, a fatty acid wax, a fatty acid amide wax, or an ester wax. In terms of humidity resistance, the ester wax such as a carnauba wax or a montan wax is preferable. Besides, a long-chain carboxylic acid and a metal salt thereof such as a stearic acid, a zinc stearate, or a calcium stearate, a low-molecular weight polyethylene wax is also preferable. These mold releasing agents may be used alone or in combination with another.

The curing accelerator can promote curing in encapsulation. The curing accelerator is not specifically limited. For epoxy resins, the cure accelerator may include an amine, an imidazole, a diazabicycloalkane, an organophosphine, a zirconium alcoholate, or a zirconium chelate. Examples of an amine include an N,N-dimethylcyclohexylamine, an N-methyldicyclohexylamine, a triethylenediamine, a diaminodiphenylsulfone, a benzyldimethylamine, and a tris-dimethylaminomethylphenol. Examples of the imidazole include a 2-methylimidazole, a 2-phenylimidazole, a heptadecylimidazole, a 2-heptadecylimidazole, a 2-ethylimidazole, and a 2-ethyl-4-methylimidazole. Examples of a diazabicycloalkane include a 1,8-diazabicyclo(5,4,0)undecene-7(DBU) and the phenol salt thereof such as U-CAT SA No. 1. Examples of an organophosphine include a triphenylphosphine(TPP), a tributylphosphine, a tricyclohexylphosphine, and a methyldiphenylphosphine. In terms of electric properties such as insulating, the TPP or the heptadecylimidazole are preferable.

The flame retardant can suppress burning of a resin encapsulant. The flame retardant may be a halogen-based one, a phosphorus-based one, and an inorganic. The halogen-based flame retardants are classified into bromine-based and chlorine-based. The bromine-based flame retardant is superior to the chlorine-based flame retardant in flame retardance. The effect is increased in combination with an antimony trioxide. The bromine-based flame retardant includes a bromized bisphenol A epoxy resin which is the most preferable one of halogen-based flame retardants. The bromine-based flame retardant further includes a tetrabromobisphenol A (TBA), 2,2-bis(4-hydroxy-3,5-dibromobenzene) (HBB), a tris(2,3-dibromopropyl) isocyanurate(TAIC-6B), 2,2-bis(4-hydroxyethoxy-3,5-dibromophenyl)propane(TBA-EO), a decabromodiphenyloxide (DBDPO), and a halogen-containing polyphosphate. The chlorine-based flame retardant preferably includes a chlorinated paraffin.

The phosphorus-based flame retardant preferably includes an ammonium phosphate, a triglycidyl phosohate(TCP), a triethylphosphate(TEP), a tris(β-chloroethyl)phosphate (TCEP), a trichloroethylphosphate(CLP), a trisdichloropropylphosphate(CRP), a cresyldiphenylphosphate(CDP), a xylenyldiphenylphosphate(XDP), an acid phosphoric esters, and a nitrogen-containing phosphorus compound.

The inorganic flame retardant preferably includes an antimony trioxide and an aluminum hydroxide. Further, the inorganic flame retardant includes a red phosphorus, a tin oxide, a zirconium hydroxide, a barium metaborate, a magnesium hydroxide, a calcium hydroxide, and a calcium aluminate hydrate.

In the present invention, the distribution of above-mentioned additives may be changed for one additive or for any combination of additives.

The process of producing an encapsulating sheet made of a resin composition will be described. The resin composition is prepared by mixing and melting a resin, e.g. an epoxy resin, a curing agent, and an additive such as a curing accelerator, a flame retardant, a filler, a mold releasing agent, or a colorant and the other additives. The composition is rolled so as to produce a resin sheet. In general, since the sheet is brittle, the sheet may be cut with a cold blade after heating on a release film, such as at about 70° to about 130° C., or with a hot blade heated at about 70° to about 130° C. keeping the film at room temperature. This temperature is high enough to melt the resin but in not enough to cure the resin.

Figure 3:
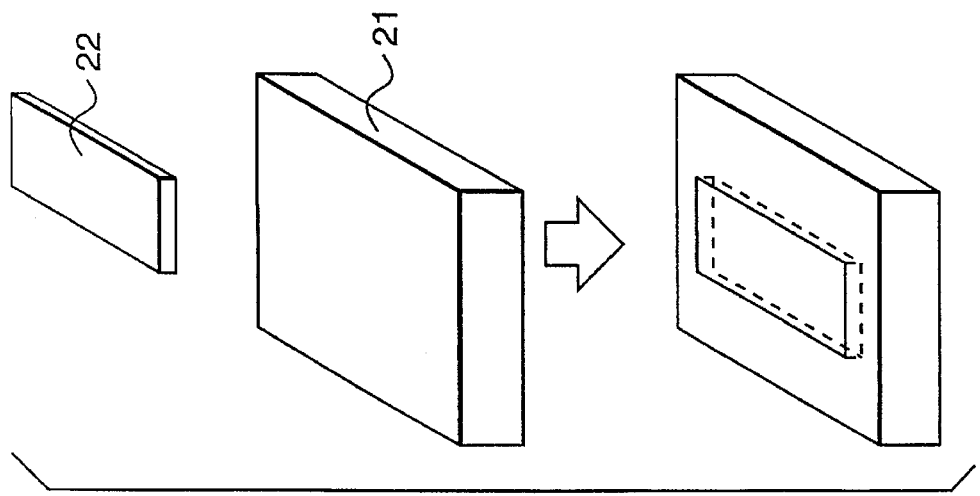
FIG. 3 is a schematic view of an encapsulating sheet of an embodiment of the present invention.

One way of forming the encapsulating sheet in which the distribution of the additives varies step-wise or continuously is to laminate two or more resin sheets, which differ in composition, by heating under pressure. After that, the laminated sheet is cut into a predetermined size. In the case using this method, the boundary of the encapsulating sheet is exposed in the flank of an encapsulant. However, this method is suitable for mass production. An alternative way is to bond together a large resin sheet 21 and a small resin sheet 22, which differ in composition by heating under pressure, as shown in FIG. 3. This method can produce the encapsulating sheet having a region that is different from the remaining region in the composition. For example, the region contacting a semiconductor chip may have a different composition than the surrounding region. According to the present invention, the distribution of an additive can vary step-wise or continuously. However, the continuous variation is better than the step-wise variation because no sharp boundaries are formed.

Figure 4:
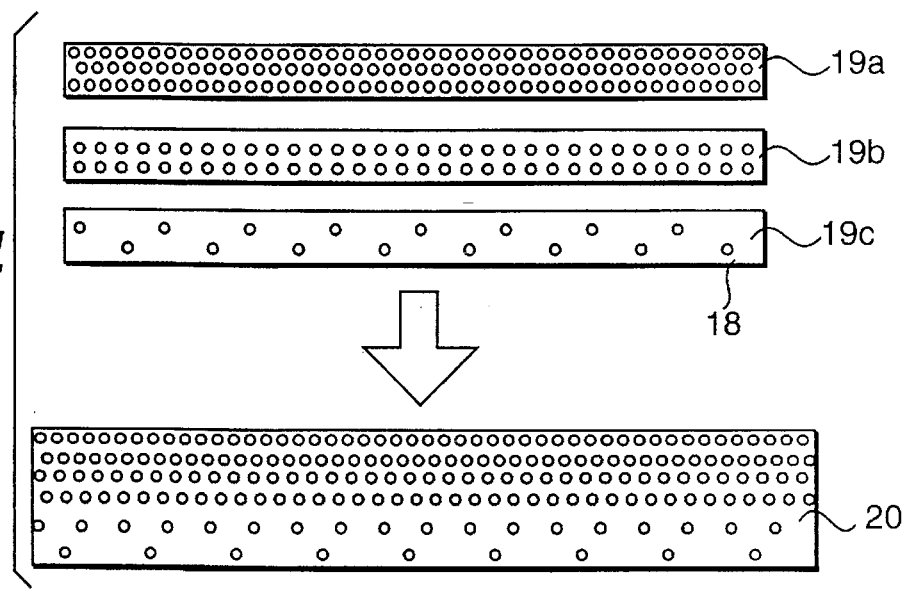
FIG. 4 is an illustrative cross-sectional view of an encapsulating, sheet of an embodiment of the present invention.
Figure 5:
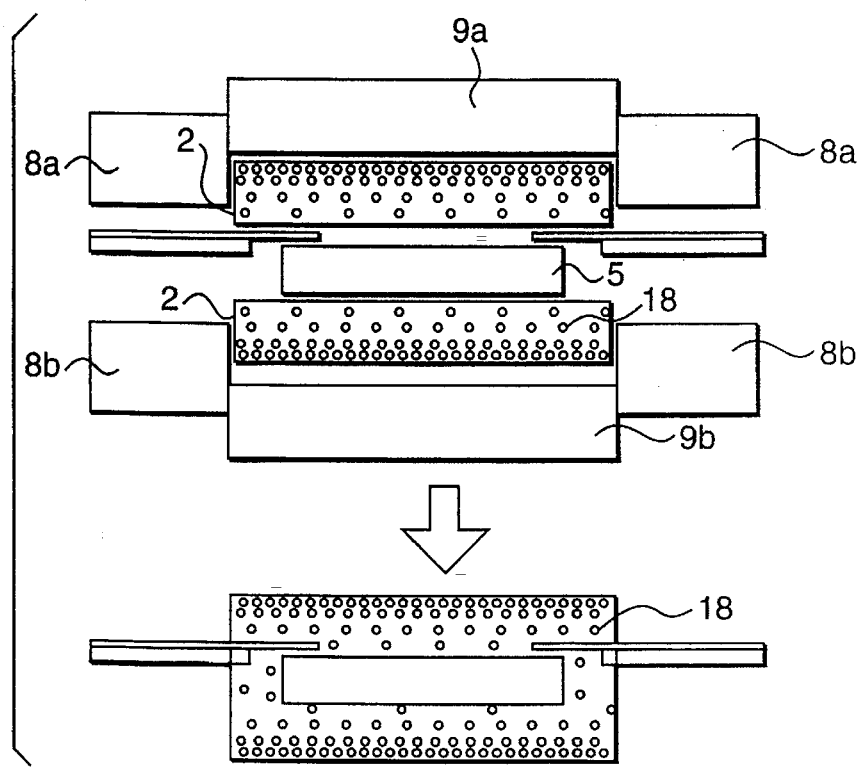
FIG. 5 is a schematic view of an apparatus for producing an embodiment of the present invention.

FIG. 4 shows a process of forming an encapsulating sheet in which the distribution of an additive 18 varies across the thickness. For example, three resin sheets 19a, 19b, and 19c, which differ in the concentration of an additive 18, such that the concentration of sheet 19a is the largest and that of the sheet 19c is the smallest, are bonded together by heating under pressure using a press. As a result of melting and mixing at the interface between the resin sheets, an encapsulating sheet in which the distribution gradually varies across the thickness is obtained. A semiconductor chip 5 is encapsulated with sheets 2, for example as shown in FIG. 5. The description of similar elements as shown in FIG. 2 is omitted. Increasing the number of resin sheets and decreasing the thickness of each resin sheet causes a smoother variation. When slowly bonded at a high temperature and using a thin resin sheet, a continuously varied encapsulating sheet may be obtained. On the other hand, when rapidly bonded at a low temperature and using a thick resin sheet, a step-wise varied encapsulating sheet may be obtained. Thus, there is not critical classification between a continuous variation and a step-wise one.

In the present invention, since the partial variation of an additive distribution can be obtained in an encapsulating sheet, the amount of the additive may be increased only in the required portion. Therefore, the desirable properties can be improved and the undesirable properties may be suppressed.

An example of two desirable conflicting properties, are a mold releasing property between a resin and a mold, and an adhesion property between the resin and a semiconductor chip. In surface-mounting, the whole device is exposed to a high temperature atmosphere at the time of soldering, such as at 200° to 240° C. for 5 to 90 seconds. Such thermal shock causes cracks to occur in the encapsulant due to the evaporation of water carried into the interior of the encapsulant. Particularly, when the adhesion between a resin and a semiconductor chip is weak, a delamination occurs and water is pooled in the interface therebetween. The pooled water causes an explosive evaporation to occur and the explosive evaporation makes a large crack. Therefore, a poor adhesive strength causes reliability to be deteriorated. If the adhesive strength of the resin and the chip is sufficiently high, the delamination may be prevented. However, increasing the adhesive strength of the resin with respect to the semiconductor chip also increases the adhesive strength with respect to and the mold. Since a high mold releasing property is required in order to avoid leaving a residual flash of the molded resin on an encapsulation. A low adhesive strength is required. Thus, achieving the desired adhesive strength and mold-releasing properties is problematic.

According to the present invention, an encapsulating sheet can be provided wherein the adhesive strength of the resin to the semiconductor chip is larger than that to the mold after curing. For example, an amount of a mold releasing agent varies between on a surface of the encapsulating sheet adjacent the mold and that adjacent the semiconductor chip. In order to obtain easy mold releasing and to maintain a strong adhesion between the chip and the resin, the amount of the mold releasing agent on the side adjacent the mold is larger than that on the side adjacent the chip. It is preferable to provide no mold releasing agent on the side adjacent the chip. The thickness of a layer having a larger amount of the mold-releasing agent in the encapsulating sheet adjacent the mold is preferably about 10 μm or more. For example, in FIG. 2, first resin sheet 1b may have a high concentration of the mold releasing agent and the second resin sheet 1a may have a low concentration of the molding releasing agent are laminated and first resin sheet 1b is positioned facing mold 401. Coating the mold releasing agent on a resin sheet may have an equivalent effect.

Further, an equivalent structure may be obtained by changing the amount of an adhesiveness imparting agent in the resin or by coating it on a resin sheet. If the adhesiveness imparting agent issued, the amount of the adhesiveness imparting agent on the side adjacent the mold is smaller than that on the side adjacent the semiconductor chip. The thickness of a layer having a larger amount of the adhesiveness imparting agent in the encapsulating sheet adjacent the semiconductor chip is preferable about 10 μm or more. A metal chelate compound is a preferable adhesiveness imparting agent. The metal chelate compound may improve a water resistance also. The metal chelate compound includes a Zr chelate, a Ti chelate, an Al chelate, etc. The Zr chelate includes a tetrakisacethylacetonato zirconium, a monobutoxytrisacetylacetonato zirconium, a dibutoxybisacetylacetonato zirconium, a tributoxyacetylacetonato zirconium, a tetrarakisethylacetylacetato zirconium, a butoxytrisethylacetylacetato zirconium, a tributoxymonoethylacetylacetato zirconium, a tetrakisethyllactato zirconium, a dibutoxybisethyllactato zirconium, a bisacetylacetonatobisethylacetylacetonato zirconium, a monoacetylacetonatotrisethylacetylacotonato zirconium, a monoacetylacetonatobisethylacetylacetonatobutoxy zirconium, and a bisacetylacetonatobisethyllactonato zirconium. Ti or Al chelates include a β-diketon, a hydroxy carboxylic acid, a ketoester, a ketoalcohol, a glycol, etc. These adhesiveness imparting agents may be used singly or in combined form.

Thermal conductivity is another desirable property for an encapsulation layer. Although good thermal conduction may be achieved by using a resin having a high concentration of an inorganic filler, the extent of the filler concentration is limited because the resin with excess fillers is too viscous for molding. For transfer molding, the upper limit is about 100 Pa-sec. If the amount of the filler is limited to such an extent that moldability is not impaired, the resulting resin can not have the high thermal conduction required of a recent ASIC, which generates a large amount of heat. In the transfer molding process, the concentration of the filler can not be varied within a resin layer. However, in the present invention, the filler concentration can be changed by using resin sheets having different concentrations of the filler. In other words, the resin sheets take part individually in moldability and thermal conductivity. Thus, both of these properties can be fully achieved. An encapsulating sheet having a high concentration of the filler, i.e. a high thermal conductivity, is preferably placed on a semiconductor chip, because the chip generates heat. However, since the active surface of the chip is easily damaged by the filler, the sheet having a high concentration of the filler is preferably provided on the bottom surface of the chip. The amount of the filler in a resin composition is preferably between about 40 to about 90 wt %. The resin composition contacting to the chip is preferably 60 to 85 wt % so as to avoid a damage.

The encapsulating sheet may be divided into sections. For example, the section of the encapsulating sheet having a low concentration of the filler, i.e. a low viscosity in molding, is preferably placed on a lead, because at the region of the lead, a good adhesion is required for encapsulation and the lead or wire is easily deformed.

Figure 6A:
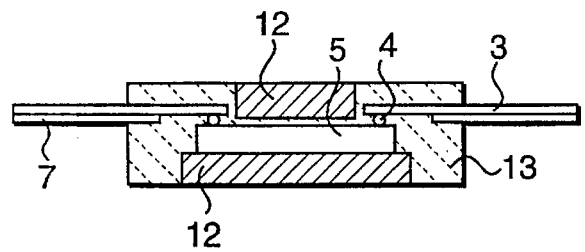
FIGS. 6(a)–6(i) are a cross-sectional views showing progressive stages during formation of an embodiment of the present invention.
Figure 6B:
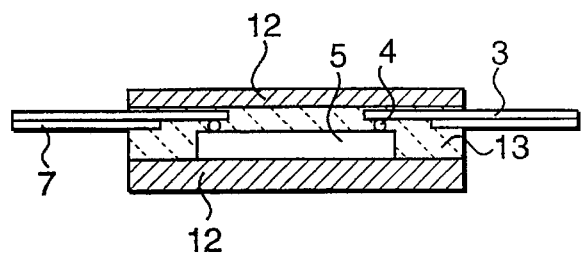
Figure 6C:
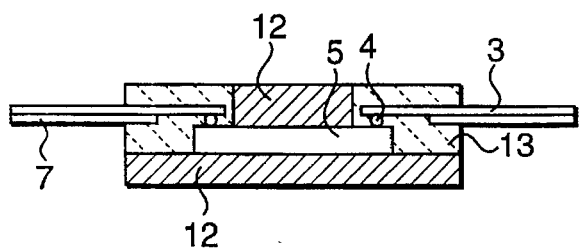
Figure 6D:
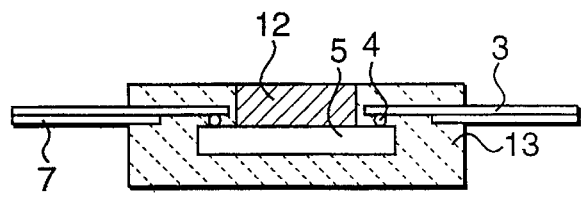

The possible arrangements are shown in FIGS. 6(a)–6(i). The semiconductor devices in FIGS. 6(a) to (d) and (i) are tape-carrier package (TCP) type devices. The pad (not illustrated) on the active surface of a semiconductor chip 5 is connected to a frame 7 (polyimide film carrier) through a bump 4 and a lead 3. Chip 5, bump 4, and lead 3 are encapsulated in the resin composition, which is composed of a first resin composition 12 having a high concentration of a filler and a second resin composition 13 having a low concentration of a filler. In FIG. 6(a), first resin composition 12 is placed on the bottom surface of chip 5, and over the active surface of chip 5. In the region of lead 3 that includes the pad and bump 4, the resin is composed of second resin composition 13. In FIG. 6(b), first resin composition 12 is extended to an edge of an encapsulant. In FIG. 6(c), first resin composition 12 is placed on the active surface. However, the region thereof is inside of a pad region. In FIG.

6(d), first resin composition 12 on the bottom surface of FIG. 6(c) is omitted.

Figure 6E:
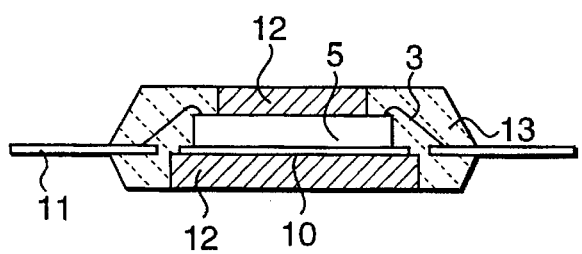
Figure 6F:
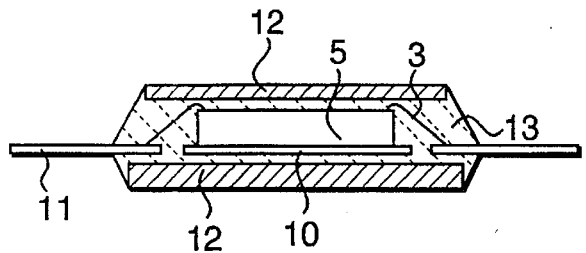
Figure 6G:
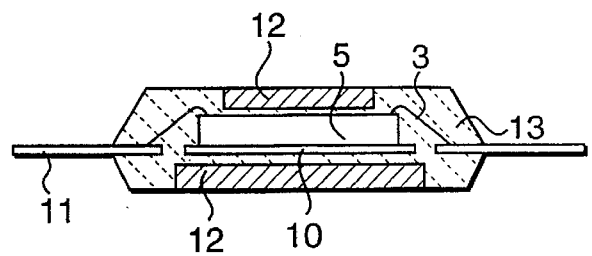
Figure 6H:
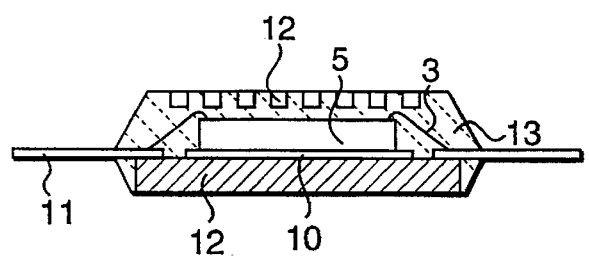

The semiconductor devices in FIGS. 6(e) to (h) and (i) are lead frame type devices. A lead frame is composed of a portion of a die pad 10 and a portion of a lead 11. A semiconductor chip 5 is fixed on die pad 10 at a bottom surface and a pad (not illustrated) on an active surface of chip 5 is connected to the lead 11 through a wire 3. First resin composition 12 is placed below the die pad 10. Wire 3 is covered with the second resin composition 13. In FIG. 6(e), first resin composition 12 on the active surface is inside of the pad region. In FIG. 6(f), first resin composition 12 is over and below chip 5 and is extended to an edge of an encapsulant. In other words, a mass of second resin composition 13 including chip 5 and wire 3 is sandwiched within a resin plate of first resin composition 12. In FIG. 6(g), the area of first resin composition 12 is limited to about the chip size. In FIG. 6(h), an upper side first resin composition 12 is divided and a lower side first resin composition is under chip 5 and lead 11.

Figure 6I:
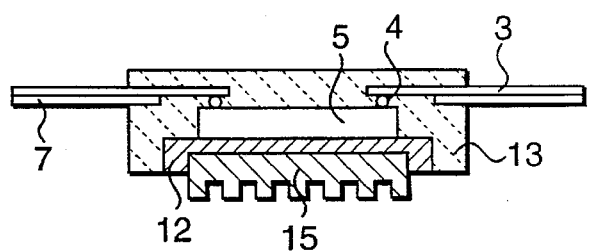
Figure 6J:
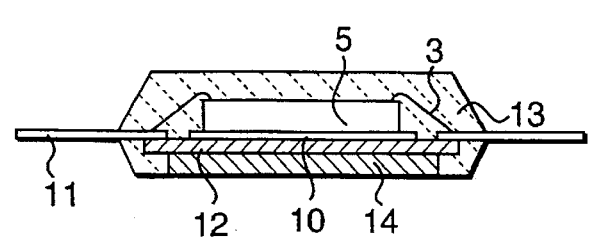

A heat spreader plate 14, 15 of metal, such as aluminum or copper, aluminum nitride, and the like, can be placed on the encapsulant. In FIGS. 6(i) and (j), radiator plate 15 is under upper first resin composition 12. The radiator plate is preferably on first resin composition 12, which has a thermal conductivity.

The first resin composition having a high thermal conductivity preferably has a thermal conductivity higher than about 5 W/mK, more preferably higher than about 8 W/mK. In order to obtain such resin, the amount of the filler in the resin composition is preferably about 60 vol. % or more, further about 70 vol. % or more. With increasing amounts of filler, the viscosity becomes higher and the moldability becomes poor. Therefore, the melt viscosity of the resin is preferably lower than about 3000 Pa-s at 175° C. measured with a KoKa flow tester in order to secure the reliability of a semiconductor device. On the other hand, the second resin composition has a high moldability, i.e. a low density of the filler. The melt viscosity is preferably lower than about 300 Pa-s at 175° C. measured with a Koka flow tester, more preferably lower than about 100 Pa-s in order to obtain a good moldability. In terms of thermal conductivity, the second resin composition preferably includes an amount of the filler to the extent which is not harmful to the moldability. The thermal conductivity of the second resin composition is preferably more than about 0.5 W/mK. A resin composition having too little thermal conductivity may be a block of heat dissipation. In the case where the second resin composition is responsible for the strength and the moldability, such as FIGS. 6(d), (i), and (j) wherein an outer surface of the encapsulant is mainly covered with the second resin composition, the amount of the filler in the first resin composition can be between about 80 to about 95 vol. %. However, the excess of filler such as that over 95 vol. % causes the adhesion to the second resin composition to be poor so that a crack may readily occur in mounting by reflow soldering or infrared reflow soldering.

According to the present invention, encapsulation can be accomplished by two resin compositions wherein one mainly contributes to the moldability and another mainly contributes to the thermal conductivity. Therefore, both desirable properties are obtained. In other words, the heat generated in the semiconductor chip is effectively dissipated through the first resin composition having a high thermal conductivity and, on the other hand, the adhesion and the strength of the encapsulant, which is especially required in a severe environment such as a high temperature or a high humidity, are achieved by the second resin composition having a low density of the filler. It is impossible in transfer molding because transfer molding can use a uniform resin only. The first resin and the second resin compositions are completely integral at their interface as the result of melting and curing at the time of molding. The bonding between the two resin compositions is stronger than that to a ceramic or a metal. The strong bonding contributes to a high resistance to package cracking. The cured resin of the first resin composition may have a coefficient of thermal expansion close to that of metals or ceramics; therefore, it can be molded integrally with metals or ceramics such as in FIGS. 6(i) (j).

Further, in terms of thermal dissipation, the active surface of a semiconductor chip is preferably covered with the first resin composition having a high thermal conductivity. However, since the resin composition has a high melt viscosity due to its high filler content, the area of the first resin composition is preferably small enough to fit into the pad to which the lead or wires are connected in order to avoid damage at the pad region.

Concerning the filler, there are a couple of variations, i.e. a resin composition in contact with a mold differs in the type or amount of the filler from an inner resin composition, which may contact a semiconductor chip. The variations are described below.

(a) The resin composition in contact with a mold contains a larger amount of the filler, and the composition in contact with a semiconductor chip contains a smaller amount of the filler.

(b) The resin composition in contact with a mold contains a large amount of the filler in a crushed form, and the composition in contact with a chip contains a larger amount of the filler in a spherical form.

(c) The resin composition in contact with a chip contains a larger amount of a low α-ray filler than that in contact with a mold.

(d) The resin composition in contact with a mold contains a large amount of the filler of a large particle diameter, and the resin composition in contact with a chip contains a large amount of the filler of a small particle diameter.

(e) The resin composition in contact with a mold contains a larger amount of the filler of a fibrous particle than that in contact with a chip.

(f) The resin composition in contact with a mold contains a larger amount of the filler of a flaky particle, which is moisture-impermeable, than that in contact with a chip.

Concerning (a), in general, as the amount of the filler in a resin composition increases, the water absorption of the resin composition is decreased but thermal conductivity and strength are increased. On the other hand, the filler will deform a bonding wire or a lead and cause a semiconductor chip to be damaged when the resin sheet is pressed to the chip, if the amount of filler is large. For avoiding the water absorption and deformation of leads and the like, and for keeping a high thermal conductivity and a high strength, the resin composition in contact with a mold, which makes an outer surface of an encapsulant, contains a larger amount of the filler than that in contact with a semiconductor chip. As a result, the water absorption and the deformation of leads can be reduced without reducing the strength and thermal conductivity of the encapsulant. The thickness of a layer of the resin composition containing a large amount of the filler in the encapsulating sheet adjacent the mold is preferably about 30 μm or more so as to avoid the water absorption. Also, the thickness of a layer of the resin composition containing a small amount of the filler or no filler in the encapsulating sheet adjacent the chip is preferably enough to cover the lead or wire, such as 30 μm or more. The filler content of the mold side is preferably 1.5 times, further 2 times, moreover 5 times or more as that of the inner side.

Concerning (b), in general, as the amount of the filler in the crushed form increases, the package cracking and the flash are reduced due to the increase of the strength of an encapsulant. On the other hand, the filler in the crushed form will deform a bonding wire or a lead and cause a semiconductor chip to be damaged when the resin sheet is pressed against the chip. Therefore, defects in a device may increase. To avoid a flash and deformation of leads and the like, and maintain a high strength, the resin composition in contact with a mold, which makes an outer surface of an encapsulant, contains a larger amount of the filler in a crushed form than that in contact with a semiconductor chip. As a result, the deformation of leads can be reduced and a flash can be avoided without reducing the strength of the encapsulant. The thickness of a layer of the resin composition containing a large amount of the crushed form filler in the encapsulating sheet adjacent the mold is preferably about 30 μm or more so as to keep the strength and avoid a flash. Also, the thickness of a layer of the resin composition containing a small amount of the crushed form filler or no crushed form filler in the encapsulating sheet adjacent the semiconductor chip is preferably enough to cover the lead or wire, such as 30 μm or more. The crushed form filler content of the mold side is preferably 1.5 times, further 2 times, moreover 5 times or more as that of the inner side, i.e. the chip side. Also, the spherical filler content of the chip side is preferably 1.5 times, further 2 times, moreover 5 times or more as that of the mold side.

Concerning (c), an α-ray due to uranium(U) or thorium (Th) contained in the filler may cause an error in operation. However, the filler reduced of the content of U and Th (U-reduced filler) is too expensive than a general-purpose filler. Therefore, the amount of the U-reduced filler is preferably small. To avoid erroneous operation at a low cost, the resin composition in contact with a semiconductor chip contains a larger amount of the U-reduced filler than the mold side resin. As a result, the occurrence of an error operation can be reduced without increasing the cost. Since the distance of the α-ray influence is limited, the thickness of the layer of the resin composition containing a large amount of the U-reduced filler is preferably about 50 μm or more. The U-reduced filler content of the chip side is preferably 1.5 times, further 2 times, moreover 5 times or more as that of the mold side.

Concerning (d), in general, as the amount of the filler having a large particle diameter increases, the package cracking and the flash are reduced due to the increase of the strength of the encapsulant. On the other hand, the filler having a large particle diameter will deform a bonding wire or a lead and cause a semiconductor chip to be damaged when the resin sheet is pressed to the chip. Therefore, defects in a device may increase. To avoid a flash and deformation of leads and the like, and maintain a high strength, the ratio of a large diameter filler in the mold side resin composition is larger than that of the chip-side resin composition. As a result, the deformation of leads can be reduced and a flash can be avoided without reducing the strength of the encapsulation. The thickness of a layer of the resin composition containing a large amount of the large diameter filler in the encapsulating sheet adjacent the mold is preferably about 70 μm or more so as to keep the strength and avoid a flash. Also, the thickness of a layer of the resin composition containing a small amount of the large diameter filler in the encapsulating sheet adjacent the semiconductor chip is preferably enough to cover the lead or wire, such as 30 μm or more. The large diameter filler content of the mold side is preferably 1.5 times, further 2 times, moreover 5 times or more as that of the inner side, i.e. the chip side. Also, the smaller diameter filler content of the chip side is preferably 1.5 times, further 2 times, moreover 5 times or more as that of the mold side.

Concerning (e), it is known that a fibrous filler contributes to the strength of an encapsulant. However, the fibrous filler has a tendency to deform a wire during pressing because of the increased melt viscosity. Further, since a fibrous filler is usually a glass fiber, a sodium(Na) contained therein causes a lower reliability because the chip is corroded by the dissolved Na. For avoiding the deformation of leads and the like, and for keeping a high strength, the amount of a fibrous filler in the mold side resin composition is larger than that of the chip-side resin composition. As a result, the deformation of leads can be reduced without reducing the strength of the encapsulant. The thickness of a layer of the resin composition containing a large amount of the fibrous filler in the encapsulating sheet adjacent the mold is preferably about 30 μm or more. Also, the thickness of a layer of the resin composition containing a small amount of the fibrous filler or no fibrous filler in the encapsulating sheet adjacent the chip is preferably enough to cover the lead or wire, such as 30 μm or more.

Concerning (f), as the thickness of the sealing resin containing fillers is increased, a moisture resistance is improved. However, using the filler in a flaky form can reduce the thickness because of the moisture-impermeability of the flaky filler. On the other hand, the flaky fillers tend to deform the leads. Therefore, the amount of a flaky filler in the mold-side resin composition is larger than that of the chip-side resin composition. As a result, the moisture resistance can be improved without increasing the thickness of the encapsulant. Further, the reliability can be improved without reducing the moisture resistance. The thickness of a layer of the resin composition containing a large amount of the flaky filler in the encapsulating sheet adjacent the mold is preferably about 30 μm or more. Also, the thickness of a layer of the resin composition containing a small amount of the flaky filler in the encapsulating sheet adjacent the semiconductor chip or no flaky filler is preferably enough to cover the lead or wire, such as 30 μm or more.

The fillers in the crushed form, near spherical form, or spherical form are preferably composed of a quartz glass or a crystalline silica. The fillers in the fibrous form are preferably composed of a glass. The fillers in the flaky form are preferably composed of a mica or metal flakes.

The above-mentioned fillers are preferably in such a form that the maximum particle size, such as diameter, is smaller than 90% of the thickness of the encapsulant in order to avoid damage to the semiconductor chip due to the filler, especially on the active surface.

Flame retardance is one of the important properties of an encapsulation layer. A good flame retardance may be achieved by adding a flame retardant to a resin. In general, a halogen-containing resin such as bromized epoxy resin is added to an encapsulating resin composition, or a heavy metal oxide such as an antimony trioxide is added. However, in a high temperature, a halogen-containing resin tends to release a halogen so as to corrode a wire of a semiconductor chip. Also, in a high temperature and a humid environment, the antimony trioxide tends to dissolve in water absorbed into the resin due to the hydrophilic of the antimony trioxide so as to corrode a wire of a semiconductor chip. Therefore, the device using a resin composition containing a large amount of the flame retardant may have impaired reliability. On the other hand, the flame retardant may include a phosphorus compounds. Since the phosphorus compound is hydrophilic, there is the same problem of the antimony trioxide. Further, the phosphorus is harmful to the human body. Moreover, the flame retardant may include a metal oxide hydrate. The water contained in the hydrate and a hydroxide ion generated from the hydrate tend to corrode an wire of a semiconductor chip. Therefore, the device using a resin composition containing a large amount of the flame retardant may also have impaired reliability. However, in the present invention, the amount of the flame retardant can be changed by using resin sheets having different densities of the flame retardant. The resin composition in contact with a semiconductor chip, i.e., an inner resin composition, contains a smaller amount of the flame retardant than that of the resin composition of an outer surface which encloses the inner resin composition, i.e., an outer resin composition. The inner resin composition may include no flame retardant. As a result, the total amount of the flame retardant in the resin composition can be reduced without reducing the flame retardance and the reliability. Therefore, the possibility of polluting the environment can be reduced.

The thickness of a layer of the outer resin composition in the capsulating sheet is preferably between about 5 to about 90% of the entire thickness of the encapsulant. In the case where a high flame retardance is required, the thickness of a layer of the outer resin composition in the encapsulating sheet is preferably between about 50 to about 90%. On the other hand, in the case where high reliability is required, in the encapsulating sheet is preferably between about 5 to about 50%. This is why it is required to increase the ratio of the resin composition largely containing the flame retardant for a good flame retardance; for a high reliability, however, it is required to reduce the ratio. The amount of the flame retardant in the outer resin composition varies depending the type used. The amount of an antimony trioxide is preferably between about 1 to about 10 wt %. The amount of a halogen-based flame retardant is preferably between about 0.5 to about 50 wt %, especially in bromized epoxy resin preferably between about 1 to about 30 wt %. The amount of a metal hydroxide is preferably between about 10 to about 80 wt %, which may be used as the above mentioned filler. The flame retardant content of the mold side is preferably 1.5 times, further 2 times or more as that of the inner side.

Productivity and reliability are two desirable properties, which are difficult to obtain in an encapsulation layer. To improve the efficiency of a producing a resin-encapsulated semiconductor device, a curing accelerator is added to the resin composition. Since the curing accelerator is usually a low molecular weight compound, a residual curing accelerator may cause corrosion. Therefore, the greater the amount of the curing accelerator, the less reliable the device. In the present invention, an inner resin composition contains a smaller amount of the curing accelerator than an outer resin composition, which encloses the inner resin composition. Since the outer resin composition is cured rapidly because of the high content of the curing accelerator, the mold can be opened rapidly. On the other hand, since the amount of the curing accelerator of the inner surface is small, the amount of a residual curing accelerator at the chip surface becomes small. Therefore, corrosion may not occur at the chip surface. As a result, the reliability can be improved without reducing the productivity.

The thickness of a layer of the resin composition containing a large amount of the curing accelerator in the encapsulating sheet adjacent the mold is preferably about 30 µm or more. Also, the thickness of layer of the resin composition containing a small amount of the curing accelerator is in the encapsulating sheet adjacent to the mold is preferably about 30 µm or more. The content of the curing accelerator is preferably selected in the range of about 0.005 and about 10 wt %, preferably about 0.1 to about 9 wt %, more preferably about 0.2 to about 8 wt %, because the excess accelerator causes a residual accelerator in the interstices of the resin; as a result. corrosion may occur and humidity resistance may be reduced. The content of the curing accelerator in the outer resin composition (p) is preferably between about 0.006 to about 10 wt % and the content in the inner resin composition (q) is preferably about 0.005 to about 9 wt % and p>1.1 q, more preferably p>1.5 q, and further more preferably p>2.0 q for a high productivity and a high reliability. In the case where a triphenylphosphine(Tpp) is used as a curing accelerator, the amount is preferably between about 0.3 to about 9 wt %. In the case of a heptadecylimidazole, it is preferably between about 0.2 to about 7 wt %.

As above-mentioned, the concentration or type of the additives including fillers, curing accelerators, mold releasing agents, adhesiveness imparting agents and flame retardants can be changed in the present invention. Moreover, as another additive, there is a colorant. In general, a package of a semiconductor device is black so as to avoid erroneous operation by irradiation. However, in IR reflow soldering, not only solders but also the package are heated by infrared irradiation because the black package easily absorbs infrared rays. As a result, the evaporation of the water contained in the package may cause cracks to occur in the package. In the present invention, the distribution of the colorant can be changed. For example, a chip-side resin composition, i.e., an inner resin composition, contains a larger amount of a black colorant than a mold-side resin composition, i.e., an outer resin composition. The outer resin composition may contain another colorant or no colorant. The layer of the inner resin composition causes a good light-screening effect. To avoid absorbing infrared rays, the layer of the outer resin composition preferably has a highly reflective color, such as white or yellow or any other light colors. The content of the black colorant of the inner resin composition (m) and that of the outer resin composition (n) preferably satisfy the relation; 0.006 wt %<m<10 wt %. 0<n<9 wt %. and m>1.1 n. more preferably m>1.5 n. Further preferably, 0.1<m<1 wt %, 0<n<0.5 wt %, and m>2n. As a result, since the high light reflectivity can prevent the package from getting hot during IR reflow soldering, the moisture resistance and reliability after soldering are improved.

There is another problem concerning the colorant. A laser marking method is usually used. In the method, a package is marked by irradiating the surface of the package with a laser beam, thereby partially destroying the surface. The destroyed portion becomes roughened and is visibly distinguished from the intact smooth surface. However, it is not always easily recognizable due to insufficient contrast between the roughened and smooth surfaces in the case of the black package. In the present invention, for example, the color of the layer composed of the outer resin composition is different from that of its underlying layer. As a result, without reducing reliability, the recognition property can be improved. Preferably, the colors which are used, greatly differ in lightness or hue. The thickness of a layer of the outer resin composition in the encapsulating sheet adjacent the mold is preferably about 1 to about 200 µm, more preferably about 1 to about 20 µm further more preferably about 1 to about 5 μm. Further, a layer of black is preferably provided in the package so as to improve a light-screening property.

For a sharp contrast between the destroyed portion and the intact portion, a black organic dye is preferably included in the outer resin composition. The amount of the dye is preferably about 0.1 to about 1.0 wt %. Since the dye, however, may reduce the reliability, the inner resin composition preferably does not contain the dye. Therefore, the inner resin composition in contact with the semiconductor chip preferably contains an inorganic pigment such as a carbon black.

The changing of the distribution of the coloring agent can be applied to produce EPROM (erasable program read only memory). The package of EPROM needs a window permitting light irradiation such as UV rays to erase information stored in the semiconductor chip. The method utilizing two molding steps-one for the window portion and another for the remainder, is known. However, the method is very complex. In the present invention, one time molding can produce an EPROM using a resin sheet in which the resin composition is transparent in the portion corresponding to the window, and in another portion the resin composition is colored to screen light. Therefore, the resin-encapsulation of the EPROM becomes easy. This method can be applied to other devices having the same requirement for a window and the like.

The colorant may include an inorganic pigment, an organic pigment, and a dye. A black pigment, especially a carbon black, is effective to screen from light. Inorganic pigments are usually dull but superior in light resistance, heat resistance solvent resistance, and screening from light.

Inorganic pigments include $ZnO$, $TiO2$, $2PbCO_3 \cdot Pb(OH)_2$, and $ZnS+BaSO_4$ as white pigment; $PbCrO_4$, $CdS+ZnO$, and $K_3[Co(NO_2)_6]$ as yellow pigments; $PbCrO_4+PbSO_4+PbMoO_4$ as orange pigments; $CdS+CdSe$, $Fe_2O_3$, and $Pb_3O_4$ as red pigments; $KFe[FeCN)_6]$, $NaFe[Fe(CN)_6]$, and $NH_4[Fe(CN)6]$ as blue pigments; $CoO+ZnO$. and $Cr_2O_3$ as green pigments, and $Fe_3O_4$ as black pigments. Inorganic pigments further include a calcium carbonate, a barium gulfate, an aluminum hydroxide, a baryta powder, an aluminum powder, and a bronze powder.

Organic pigments and dyes include an azo compound, an anthraquinone, and a quinacridone as red and orange pigments: a triphenylmethane lake, an oxazine, and an anthraquinone as violet pigments and dyes; a phthalocyanine, an indanthrone, an anthraquinone, and a triphenylmethane lake as blue pigments and dyes; a phthalocyanine. and an anthraquinone as green pigments, and a diamond black which is an oxidation condensate of aniline as black dyes. These pigments and dyes may be used alone or in combination with another.

The black organic dyes, which are preferably used in the present invention are metal dyes including azo dyes, especially monoazo dyes. The monoazo dyes contain such metals as copper, potassium, sodium, chromium, and cobalt. Copper and chromium are particularly suitable. The metal content is preferably about 0.01 to about 20 wt %. The dye preferably has a melting point higher than about 100° C. and a decomposition point higher than about 200° C. The amount of the colorant is preferably between about 0.005 wt % to about 10 wt %, more preferably about 0.05 to about 5 wt %, further about 0.1 to about 2 wt %. With a lesser amount of the colorant, it is difficult to obtain sufficient coloring. With an excess of the colorant, the colorant remaining in the interstices of the resin may cause corrosion of the semiconductor chip and may reduce the moisture resistance. In marking, a carbon dioxide gas laser, a YAG laser, and semiconductor lasers may be used. The intensity of laser for marking is preferably about 0.05 to about 2 $J/cm^2$, more preferably about 0.1 to about 1 $J/cm^2$, further about 0.2 to about 0.5 $J/cm^2$.

As above-mentioned, in the present invention, the distribution of the additive in a resin-encapsulating sheet is changed. After curing, the ratio of the thickness of each resin composition is not substaintially changed. Therefore, the resultant plastic-encapsulated semiconductor device has a resin-encapsulating layer having the same distribution of the encapsulating sheet.

Figure 7A:
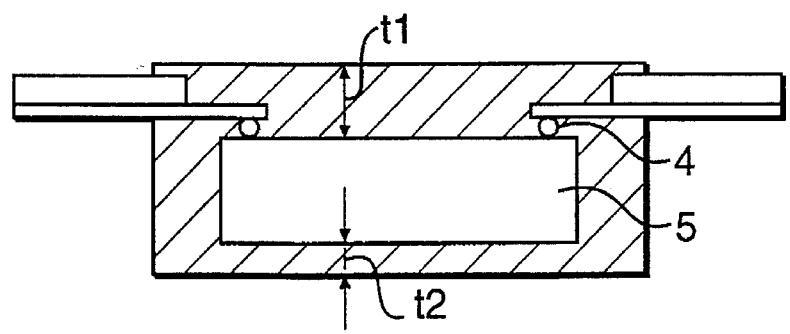
FIGS. 7(a) and 7(b) are a cross-sectional views of an embodiment of the present invention.
Figure 7B:
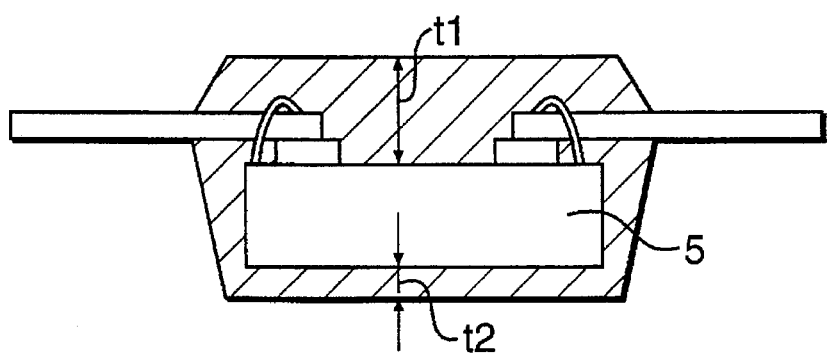
Figure 8:
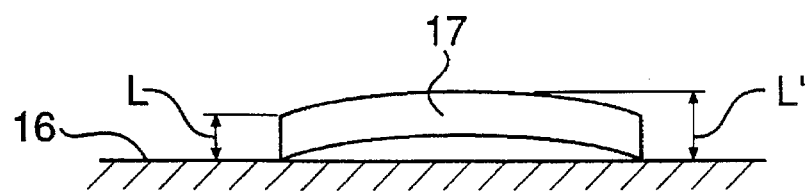
FIG. 8 is a schematic view of an embodiment of the present invention.

There is a possibility that a thermal expansivity, an elastic modulus, and a thickness of the encapsulating layer are different between the upper side of the chip (the active side) and the lower side of the chip (the bottom side). FIG. 7(a) shows a TAB type package and FIG. 7(b) shows a LOC (Lead on Chip) type. The thickness of the encapsulant of one side ($t_1$), such as that adjacent the active surface, is different from that of another side ($t_2$), such as that adjacent the bottom surface. The difference in the thickness, the coefficient of thermal expansion, or the elastic modulus between both sides may cause the stress and cause the package to warp. Warped package are difficult to mount. Further, warping causes cracking of the chip, cracking in the encapsulant, and damage to wires. Therefore, reliability may be impaired. A relationship between the amount of warping and properties such as a heat shock resistance and a moisture resistance has been discovered wherein the heat shock resistance and the moisture resistance are greatly reduced when the amount of the warp exceeds about 6%. In the present invention, as showing in FIG. 8, the amount of warping is represented by the following formula:

$$\{(L'-L)/L\} \times 100 (\%)$$

where L denotes the thickness of the package, which can be measured by placing the device 17 on a flat surface 16 immediately after molding, and L' denotes the maximum height of the package measured from the flat surface.

Lesser amounts of warping can be obtained by changing the thickness, the coefficient of thermal expansion, or the elastic modulus of the encapsulant on one side of the semiconductor chip relative to that on the other side. When the encapsulating layer of one side of the semiconductor chip has the coefficient of thermal expansion (a) ($K^{-1}$), the elastic modulus (b) (Pa), and the thickness (c) (mm) after curing, and the encapsulating layer of another side has the coefficient of thermal expansion (d) ($K^1$), the elastic modulus (e) (Pa), and the thickness (f) (mm), these preferably satisfy the following relation; $0.8<(abc/def)<1.2$, more preferably $0.9<(abc/def)<1.1$. Ideally, the value of (abc) is equal to that of (def). In the case where the difference in the thickness is large, such as $c>1.1f$, further $c>1.2f$, it is effective to satisfy the relation for preventing excessive warping. In other words, the distribution of the additive is preferably controlled so that the relation is satisfied.

Besides the above-mentioned additives, a stress-reducing agent, such as a rubber particle, an elastomer particle or a silicone gel particle may be included in a resin composition. The maximum particle diameter is preferably smaller than about 90% of the thickness of the encapsulating layer on a semiconductor chip, especially on an active surface so as to avoid damage to the chip, such as breaking wires.

The resin composition may be reinforced with a fabric. The fabric may be made of glass, quartz, carbon, silicon carbide, aluminum nitride, alumina, zirconia, and potassium titanate as inorganic materials; and nylon, acrylate, vinylon, polyvinyl chloride, polyester, aramide, phenolic, rayon, acetate, cotton, flax, silk, and wool as organic materials. The prepreg reinforced with fabric can be obtained by following method. The method includes dissolving resin including hardener, additives in a solvent, such as acetone; applying the solution to a fabric or impregnation the solution into a fabric, and evaporating the solvent by standing, heating, or evacuation.

In the present invention, an encapsulant may include a metal sheet or a ceramic sheet which are laminated with the sealing resin composition. The thickness of the sheet is preferably about 1000 μm or less. Further, the sheet may take a part of a radiator. The thermal conductivity of the sheet is preferably high. Therefore, the metal sheet is preferably made of iron, copper, aluminum, nickel, chromium, zinc, tin, silver, gold, lead, magnesium, titanium, zirconium, tungsten, molybdenum, cobalt, stainless steel, 42-nickel-iron alloy, brass, duralmin, and alloys thereof. Further the ceramic sheet is preferably made of alumina, aluminum nitride, silicon nitride, boron nitride, magnesia, and crystalline silica. It is effective to use a light material which can be processed into a thin sheet for reducing the weight and thickness of the device.

EXAMPLES

The present invention will be described with reference to the following examples.

Synthesis Example 1 of Resin Compositions

Resin compositions 1 to 6 are prepared from the following raw materials.

(1) a first epoxy resin: YX-4000H (Yuka Shell Epoxy Co. Ltd.)

4,4'-bis (2,3-epoxypropoxy)-3,3'-5,5'-tetramethylbiphenyl an epoxy equivalent of 193 a melting point of 100° C.

(2) a second epoxy resin: Epikoto 1001 (Yuka Shell Epoxy Co., Ltd.)

bisphenol A epoxy resin an epoxy equivalent of 480 a softening point of 68° C.

(3) a third epoxy resin: Epikoto 807 (Yuka Shell Epoxy Co., Ltd.)

bisphenol F epoxy resin an epoxy equivalent of 170 a viscosity of 30 Ps (4) a fourth epoxy resin: ESX-221 (Sumitomo Chemical Co. Ltd.)

an epoxy equivalent of 220 a softening point of 85° C.

(5) a fifth epoxy resin: ESCN-195XL (Sumitomo Chemical Co. Ltd.)

o-cresol novolak epoxy resin an epoxy equivalent of 197

(6) a first phenol resin: BRL-556 (Showa Kobunshi Co,Ltd.)

a hydroxyl equivalent of 104

(7) a second phenol resin: XL-225L (Mitsui Toatsu Chemicals,Inc.)

a hydroxyl equivalent of 180 a softening point of 84° C.

(8) a silane coupling agent: A-187 (Nihon Unka K.K.)

(9) a carbon black: CB-30 (Mitsubishi Chemical Industries Ltd.)

(10) a curing accelerator: CI7Z (Shikoku Kasei Co., Ltd.) heptadecylimidazole

(11) a silicone gel: thermoserring type adduct silicone gel

(12) a MBS resin: an average particle diameter of 30 μm

(13) a mold releasing agent: a carnauba wax

(14) a flame retardant: an antimony trioxide

(15) an inorganic filler:

A) fused silica particles;
spherical, the average diameter of 8 μm

B) fused silica particles:
crushed form, the average diameter of 7 μm

C) alumina particles;
rounded. the average diameter of 20 μm

D) alumina particles;
spherical, the average diameter of 0.5 μm

E) silicon nitride particles;
crushed form, the average diameter of 3 μm

F) silicon nitride;
rounded, the average diameter of 20 μm water-proof surface-treated G) boron nitride particles;
hexagonal plates, the average diameter of 0.8 μm The resin compositions are made of the above-listed raw materials according to the ratio in parts by weight shown in Table 1 in the following manner. The volume percent of the filler calculated from the density is also shown in Table 1.

First of all, the phenol resin is melted in a universal mixer. The molten phenol resin is mixed with the silicone gel and the MBS resin powder. The resulting mixture is further mixed using a three-roll mixer for uniform dispersion and size reduction of the MBS resin powder so as to make a preliminary mixture. The filler is treated with the silane coupling agent using a Henschel mixer. The treated filler, the preliminary mixture, the epoxy resin and other components are mixed in the Henschel mixer. The resulting mixture is further mixed at 60° to 110° C. using a two-roll mixer. Thus, the resin compositions are obtained.

The following properties of the resin compositions are listed in Table I:

(1) fluidity:

evaluated in terms of melt viscosity at 175° C. measured with a Koka flow tester (2) coefficient of thermal expansion, flexural modulus, flexural strength, and thermal conductivity:

Test pieces are prepared by transfer molding at 175° C. for 3 minutes. After post-curing at 180° C. for 8 hours, the properties are measured.

In Table 1, the resin compositions 1, 3 and 5 are superior in thermal conductivity, whereas the resin compositions 2, 4, and 6 are superior in moldability.

Examples 1 to 10

Encapsulating sheets are made of the above-mentioned resin compositions as shown in FIGS. 6(a) to (j). Table 2 shows the kind of a semiconductor chip, and the combination of the resin sheets used in each example. The mold described in FIG. 2 is used. The chip size of TAB type is 5 mm×15 mm×200 μm and the resultant package size is 8 mm×18 mm×500 μm. The chip size of a wire bonding type is 15 mm×15 mm×450 μm and the resultant package size is 25 mm×25 mm×3000 μm.

Table 3 shows the following properties of each example.

(1) Moldability

The moldability is evaluated by visually inspecting voids and flow marks as the following:

"good": no void and no flow mark;
"fair": voids which are larger than 0.2 mm are found in 1 to 5% of the package, and no flow marks;
"poor": voids are found in 5 to 20% of the packages, and flow marks are noticed on the surface of the packages; and
"Not moldable": molding is not possible.

(2) Heat dissipation

The heat dissipation is examined by measuring the steady-state temperature on the upper surface, i.e. the active surface side, of the device during its operation. The amount of heat generated in each semiconductor chip is 1 W.

(3) Heat-shock resistance

The heat-shock resistance is examined by cooling-heating cycle test (TCT) where one cycle includes −65° C. for 30 min., room temperature for 5 min. and +150° C. for 30 min., and is described as percent defective of 20 samples after 100 to 1000 cycles.

(4) Moisture resistance

The moisture resistance is examined by the pressure cooker test (PCT) that is to heat the device in a pressure cooker filled with saturated steam at 127° C. and 2.5 atm., and is described as Percent defective of 20 samples after 100 to 1000 hours.

(5) Soldering resistance

The soldering resistance is examined by the manner that after moisture absorption at 85° C. and 85% RH for 72 hours, samples are dipped in a soldering bath at 240° C. for 30 seconds, and described as percent cracking of 20 samples. Further, the soldered samples are heated in a pressure cooker filled with saturated steam at 127° C. and 2.5 atm. Percent defective of 20 samples after 100 to 1000 hours is shown in Table 3, also.

Comparative Examples 1 to 4

The same size samples of Example 1 are prepared by transfer molding with resin compositions in Table 4(1) as Comparative examples 1 and 2. The same size sample of Example 5 is prepared in the same manner of Example 5 with one resin composition in Table 4(1) as Comparative example 3. The same size samples of Example 1 are prepared by transfer molding with a resin composition in Table 4(1) as Comparative example 4. The properties of Comparative examples are described in Table 4(2).

TABLE 1

| Resin Composition No. | 1 | 2 | 3 | 4 | 5 | 6 |
|---|---|---|---|---|---|---|
| 1st epoxy resin (YX-4000H) | 14.1 | 14.1 | | | | |
| 2nd epoxy resin (Epicoto 101) | | | 2.6 | 2.6 | | |
| 3rd epoxy resin (Epicoto 807) | 0.92 | 0.92 | | | 0.92 | 0.92 |

TABLE 1-continued

| Resin Composition No. | 1 | 2 | 3 | 4 | 5 | 6 |
|---|---|---|---|---|---|---|
| 4th epoxy resin (ESX-221) | | | 16.1 | 16.1 | | |
| 5th epoxy resin (ESCN-195XL) | | | | | 14.4 | 14.4 |
| 1st phenol resin (BRL-556) | 8.2 | 8.2 | | | 8.2 | 8.2 |
| 2nd phenol resin (XL-255L) | | | 14.2 | 14.2 | | |
| silane coupling agent (A-187) | 0.8 | 0.4 | 0.6 | 0.5 | 0.6 | 0.6 |
| carbon black (CB-30) | 0.3 | 0.3 | 0.4 | 0.4 | 0.3 | 0.3 |
| Silicone gel | | | | 0.5 | | |
| MBS resin | | | | 0.7 | | |
| curing accelerator | 0.4 | 0.3 | 0.4 | 0.4 | 0.4 | 0.4 |
| mold releasing agent | 0.4 | 0.4 | 0.4 | 0.4 | 0.4 | 0.4 |
| flame retardent | 2.0 | 2.0 | 2.5 | 2.5 | 2.0 | 2.0 |
| filler | | | | | | |
| (A) | | | | | | 44.0 |
| (B) | | | | | | 8.8 |
| (C) | | | | | 21.0 | |
| (D) | 84.0 | 31.5 | 54.6 | 42.0 | 21.0 | 33.6 |
| (E) | | | 98.8 | 76.0 | | 30.4 |
| (F) | 222.0 | 111.0 | 96.2 | 74.0 | 185.0 | |
| (G) | 40.0 | | | | | |
| amount of filler (val. %) | 81 | 63 | 68 | 62 | 73 | 62 |
| melt viscosity (Pa-S) | ≧20000 | 90.0 | 4200 | 60.0 | 6500 | 50.0 |
| coefficient of thermal expasion ($10^{-6}$/k) | 0.5 | 1.5 | 1.0 | 1.2 | 0.9 | 1.6 |
| flexural modulas ($10^9$ Pa) | 54.0 | 18.5 | 21.0 | 19.7 | 22.5 | 13.5 |
| flexural strength ($10^6$ Pa) | 110.0 | 180.0 | 195.0 | 190.0 | 150.0 | 185.0 |
| thermal conductivity (W/mk) | 22.5 | 3.2 | 9.2 | 2.7 | 9.8 | 0.7 |

TABLE 2

| Example No. | 1 | 2 | 3 | 4 | 5 | 6 | 7 | 8 | 9 | 10 |
|---|---|---|---|---|---|---|---|---|---|---|
| Type of device of FIG. 6 | a | b | c | d | e | f | g | h | i | j |
| resin composition No. | | | | | | | | | | |
| 1st resin composition 12 | 1 | 3 | 5 | 1 | 3 | 5 | 1 | 5 | 3 | 5 |
| 2nd resin composition 13 | 2 | 4 | 6 | 2 | 4 | 6 | 6 | 6 | 4 | 6 |

*Example 9 provides an aluminium plate 15.
*Example 10 provides an aluminium nitride plate 14.

TABLE 3

| Example No. | 1 | 2 | 3 | 4 | 5 | 6 | 7 | 8 | 9 | 10 |
|---|---|---|---|---|---|---|---|---|---|---|
| Moldability | good | good | good | good | good | good | good | good | good | good |
| steady-state temp. (°C.) | 50 | 58 | 55 | 54 | 60 | 65 | 63 | 68 | 48 | 55 |
| TCT | | | | | | | | | | |
| 100 cycles | 0/20 | 0/20 | 0/20 | 0/20 | 0/20 | 0/20 | 0/20 | 0/20 | 0/20 | 0/20 |
| 200 cycles | 0/20 | 0/20 | 0/20 | 0/20 | 0/20 | 0/20 | 0/20 | 0/20 | 0/20 | 0/20 |
| 400 cycles | 0/20 | 0/20 | 0/20 | 0/20 | 0/20 | 0/20 | 0/20 | 0/20 | 0/20 | 0/20 |

TABLE 3-continued

| Example No. | 1 | 2 | 3 | 4 | 5 | 6 | 7 | 8 | 9 | 10 |
|---|---|---|---|---|---|---|---|---|---|---|
| 700 cycles | 0/20 | 0/20 | 0/20 | 0/20 | 0/20 | 0/20 | 0/20 | 0/20 | 0/20 | 0/20 |
| 1000 cycles | 0/20 | 0/20 | 0/20 | 0/20 | 0/20 | 0/20 | 0/20 | 0/20 | 0/20 | 0/20 |
| PCT | | | | | | | | | | |
| 100 h | 0/20 | 0/20 | 0/20 | 0/20 | 0/20 | 0/20 | 0/20 | 0/20 | 0/20 | 0/20 |
| 200 h | 0/20 | 0/20 | 0/20 | 0/20 | 0/20 | 0/20 | 0/20 | 0/20 | 0/20 | 0/20 |
| 400 h | 0/20 | 0/20 | 0/20 | 0/20 | 0/20 | 0/20 | 0/20 | 0/20 | 0/20 | 0/20 |
| 700 h | 0/20 | 0/20 | 0/20 | 0/20 | 0/20 | 0/20 | 0/20 | 0/20 | 0/20 | 0/20 |
| 1000 h | 0/20 | 0/20 | 0/20 | 0/20 | 0/20 | 0/20 | 0/20 | 0/20 | 1/20 | 1/20 |
| PCT after soldering | | | | | | | | | | |
| 100 h | 0/20 | 0/20 | 0/20 | 0/20 | 0/20 | 0/20 | 0/20 | 0/20 | 0/20 | 0/20 |
| 200 h | 0/20 | 0/20 | 0/20 | 0/20 | 0/20 | 0/20 | 0/20 | 0/20 | 0/20 | 0/20 |
| 400 h | 0/20 | 0/20 | 0/20 | 0/20 | 0/20 | 0/20 | 0/20 | 0/20 | 0/20 | 0/20 |
| 700 h | 0/20 | 0/20 | 0/20 | 0/20 | 0/20 | 0/20 | 0/20 | 0/20 | 1/20 | 0/20 |
| 1000 h | 1/20 | 0/20 | 0/20 | 2/20 | 0/20 | 0/20 | 0/20 | 2/20 | 2/20 | 1/20 |

TABLE 4

(1)

| Comparative example No. | 1 | 2 | 3 | 4 |
|---|---|---|---|---|
| Type of device of FIG. 6 | b | c | b | d |
| resin composition No. | 2 | 3 | 2 | 4 |

(2)

| Comparative example No. | 1 | 2 | 3 | 4 |
|---|---|---|---|---|
| Moldablity | poor | X | poor | fair |
| steady-state temperature (C.) | 78 | — | 95 | 110 |
| TCT | | | | |
| 100 cycles | 0/20 | — | 0/20 | 0/20 |
| 200 cycles | 0/20 | — | 1/20 | 0/20 |
| 400 cycles | 3/20 | — | 4/20 | 0/20 |
| 700 cycles | 5/20 | — | 7/20 | 1/20 |
| 1000 cycles | 9/20 | — | 15/20 | 2/20 |
| PCT | | | | |
| 100 h | 0/20 | — | 0/20 | 0/20 |
| 200 h | 0/20 | — | 1/20 | 0/20 |
| 400 h | 2/20 | — | 3/20 | 0/20 |
| 700 h | 3/20 | — | 5/20 | 0/20 |
| 1000 h | 5/20 | — | 9/20 | 1/20 |
| PCT after soldering | | | | |
| 100 h | 1/20 | — | 2/20 | 0/20 |
| 200 h | 3/20 | — | 10/20 | 0/20 |
| 400 h | 8/20 | — | 20/20 | 0/20 |
| 700 h | 17/20 | — | — | 2/20 |
| 1000 h | 20/20 | — | — | 3/20 |

*Comparative example 2 can not be molded.

The semiconductor devices in Examples 1 to 10 are superior to the devices in Comparative examples 1 to 4 in heat dissipation. Further, Examples 1 to 10 are superior to Comparative examples 1 to 4 in other properties, especially, in the reliability which is proved by TCT and PCT after soldering.

Therefore, the present invention can provide a resin-encapsulated semiconductor device which has a good heat dissipation and a good adhesion between a semiconductor chip and a resin by changing a distribution of an inorganic filler in a resin composition.

Synthesis Example 2 of Resin Compositions

Resin compositions 7 to 14 are prepared from the following raw materials:

(1) a first epoxy resin: YX-4000H (Yuka Shell Epoxy Co., Ltd.)
(2) a second epoxy resin: ESX-221 (Sumitomo Chemical Co., Ltd.)
(3) a third epoxy resin: ESCN-195XL (Sumitomo Chemical Co., Ltd.)
(4) a firstphenol resin: BRL-556 (Showa Kobunshi Co, Ltd.)
(5) a secondphenol resin: XL-225L (Mitsui Toatsu Chemicals, Inc.)
(6) a silane coupling agent: A-187 (Nihon Unka K.K.)
(7) a carbon black: CB-30 (Mitsubishi Chemical Industries Ltd.)
(8) a curing accelerator: C17Z (Shikoku Kasei Co., Ltd.)
(9) a silicone gel: thermosetting type adduct silicone gel
(10) a MBS resin: an average particle diameter of 30 μm
(11) a mold releasing agent: an ester wax
(12) a flame retardant: an antimony trioxide
(13) an inorganic filler:
   A) fused silica particles: GR-80AK (Toshiba Ceramics Co. ,Ltd.) the maximum diameter of 100 μm or more;
   B) fused silica particles: PK451 (Nihon Kagaku Kogyo K.K.) the maximum diameter of 40 μm or less;

The resin compositions are made of the above-listed raw materials according to the ratio in parts by weight shown in Table 5 in the same manner as the synthesis example 1.

The coefficient of thermal expansion and elastic modulus of the resin compositions are measured with pieces produced by the same manner of the synthesis example 1, and listed in Table 5.

Examples 11 to 16 and Comparative Examples 5 to 10

Encapsulating sheets are made of the above-mentioned resin compositions in the following manner. First, a resin sheet is produced by pressing to 50 to 400 urn in thickness and thereafter is cut in sizes of 5×15 mm for an active surface side of a semiconductor chip and 7×17 mm for a bottom surface side. The sheets are temporarily fixed to a semiconductor chip. The chip size is 5 mm×15 mm×200 μm. After that, encapsulation is carried out at a molding temperature at 180° C. for 1 min. and thereafter post-curing at 175° C. for 8 hours is carried out. Table 6 shows the combination of the resin sheets used in each example. In Table 6, (abc)/(def) is calculated value from the coefficient of thermal expansion (a) ($K^{-1}$), the elastic modulus (b) (Pa), and the thickness (c) (mm) after curing of the encapsulating layer of the active surface side of the semiconductor chip, and the coefficient of thermal expansion (d) ($K^1$), the elastic modulus (e) (Pa), and the thickness (f) (mm) of the encapsulating layer of the bottom side. The package size is 8 mm×18 mm×380 to 450 μm.

Table 7 shows the following properties of each example:
(1) Heat-shock resistance same as Examples 1 to 10;
(2) Moisture resistance same as Examples 1 to 10; and
(3) The amount of warping shown in FIG. 7.

TABLE 5

| resin composition No. | 7 | 8 | 9 | 10 | 11 | 12 | 13 | 14 |
|---|---|---|---|---|---|---|---|---|
| 1st epoxy resin (YX-4000H) | 8.5 | 8.5 | 8.5 | 8.5 | | | | |
| 2nd epoxy resin (ESX-221) | | | | | 11.0 | 11.0 | 11.0 | 11.0 |
| 3rd epoxy resin (ESCN-195XL) | 2.1 | 2.1 | 2.1 | 2.1 | | | | |
| 1st pleral resin (BRL-556) | 5.3 | 5.3 | 5.3 | 5.3 | | | | |
| 2nd pleral resin (XL-225L) | | | | | 4.9 | 4.9 | 4.9 | 4.9 |
| Silane coupling agent (A-187) | 0.5 | 0.5 | 0.5 | 0.5 | 0.5 | 0.5 | 0.5 | 0.5 |
| carbon block (CB30) | 0.3 | 0.3 | 0.3 | 0.3 | 0.3 | 0.3 | 0.3 | 0.3 |
| curing accelerator (C17Z) | 0.4 | 0.4 | 0.4 | 0.4 | 0.4 | 0.4 | 0.4 | 0.4 |
| eilicone gel | 1.0 | 1.0 | 1.0 | 1.0 | 1.0 | 1.0 | 1.0 | 1.0 |
| MBS resin | 1.5 | 1.5 | 1.5 | 1.5 | 1.5 | 1.5 | 1.5 | 1.5 |
| mold releasing agent | 0.4 | 0.4 | 0.4 | 0.4 | 0.4 | 0.4 | 0.4 | 0.4 |
| flame retardant filler | 2.0 | 2.0 | 2.0 | 2.0 | 2.0 | 2.0 | 2.0 | 2.0 |
| (A) | | | | | 72.0 | 75.0 | 78.0 | 81.0 |
| (B) | 72.0 | 75.0 | 78.0 | 81.0 | | | | |
| cofficient of thermal expansion ($10^{-5}$/k) | 1.80 | 1.58 | 1.31 | 1.01 | 1.87 | 1.64 | 1.33 | 1.01 |
| elastic modulus ($10^7$ Pa) | 970 | 1086 | 1231 | 1430 | 1120 | 1207 | 1351 | 1686 |

TABLE 6

| | Example | | | | | | Comparative example | | | | | |
|---|---|---|---|---|---|---|---|---|---|---|---|---|
| | 11 | 12 | 13 | 14 | 15 | 16 | 5 | 6 | 7 | 8 | 9 | 10 |
| Thickness of the encapsulant on the active surface after molding (mm) | 0.10 | 0.10 | 0.13 | 0.13 | 0.14 | 0.16 | 0.10 | 0.10 | 0.13 | 0.13 | 0.14 | 0.14 |
| Thickness of the encapsulant on the bottom surface after molding (mm) | 0.08 | 0.08 | 0.10 | 0.10 | 0.09 | 0.09 | 0.08 | 0.08 | 0.10 | 0.10 | 0.09 | 0.09 |
| resin compositon No. on the active surface | 10 | 10 | 10 | 9 | 10 | 10 | 8 | 8 | 13 | 14 | 7 | 7 |
| resin composition No. on the bottom surface | 12 | 13 | 13 | 12 | 11 | 12 | 8 | 14 | 13 | 9 | 8 | 8 |
| (abc)/(def) | 0.91 | 1.00 | 1.05 | 1.06 | 1.07 | 1.14 | 1.25 | 1.26 | 1.30 | 1.37 | 1.56 | 1.58 |

TABLE 7

| | Example | | | | | | Comparative example | | | | | |
|---|---|---|---|---|---|---|---|---|---|---|---|---|
| | 11 | 12 | 13 | 14 | 15 | 16 | 5 | 6 | 7 | 8 | 9 | 10 |
| TCT | | | | | | | | | | | | |
| 50 cycles | 0/20 | 0/20 | 0/20 | 0/20 | 0/20 | 0/20 | 0/20 | 0/20 | 0/20 | 1/20 | 5/20 | 4/20 |
| 100 cycles | 0/20 | 0/20 | 0/20 | 0/20 | 0/20 | 0/20 | 0/20 | 0/20 | 2/20 | 1/20 | 5/20 | 4/20 |
| 150 cycles | 0/20 | 0/20 | 0/20 | 0/20 | 0/20 | 0/20 | 2/20 | 3/20 | 6/20 | 4/20 | 7/20 | 6/20 |
| 300 cycles | 0/20 | 0/20 | 0/20 | 0/20 | 0/20 | 0/20 | 3/20 | 4/20 | 8/20 | 7/20 | 8/20 | 9/20 |

TABLE 7-continued

|  | Example | | | | | | Comparative example | | | | | |
| --- | --- | --- | --- | --- | --- | --- | --- | --- | --- | --- | --- | --- |
|  | 11 | 12 | 13 | 14 | 15 | 16 | 5 | 6 | 7 | 8 | 9 | 10 |
| 500 cycles PCT | 0/20 | 0/20 | 0/20 | 0/20 | 0/20 | 0/20 | 4/20 | 7/20 | 9/20 | 11/20 | 14/20 | 13/20 |
| 100 h | 0/20 | 0/20 | 0/20 | 0/20 | 0/20 | 0/20 | 0/20 | 0/20 | 3/20 | 2/20 | 4/20 | 5/20 |
| 200 h | 0/20 | 0/20 | 0/20 | 0/20 | 0/20 | 0/20 | 0/20 | 0/20 | 3/20 | 4/20 | 4/20 | 5/20 |
| 300 h | 0/20 | 0/20 | 0/20 | 0/20 | 0/20 | 0/20 | 1/20 | 2/20 | 6/20 | 5/20 | 5/20 | 6/20 |
| 500 h | 0/20 | 0/20 | 0/20 | 1/20 | 0/20 | 1/20 | 4/20 | 2/20 | 7/20 | 9/20 | 6/20 | 6/20 |
| 1000 h | 0/20 | 2/20 | 0/20 | 2/20 | 1/20 | 3/20 | 5/20 | 4/20 | 7/20 | 12/20 | 7/20 | 6/20 |
| warpage |  |  |  |  |  |  |  |  |  |  |  |  |
| (L'L) | 5 | 3 | 8 | 10 | 12 | 11 | 28 | 31 | 35 | 44 | 75 | 68 |
| (L'-L)/L (%) | 2.78 | 1.67 | 3.48 | 4.35 | 5.22 | 4.78 | 15.56 | 17.22 | 15.22 | 19.13 | 32.61 | 29.57 |

The semiconductor devices in Examples 11 to 16 have an amount of warping less than 6% but in Comparative examples 5 to 10 more than 6%. As a result, passivation cracks occur in the Comparative examples. Further, in Comparative examples 9 and 10, which have large warpage, such as 60 µm or more, cracking in a chip occurs. Furthermore, the reliability is deteriorated due to delamination between the chip and the resin causing water absorption, which may cause breaking lines by corrosion.

Therefore, the present invention can provide a semiconductor device without cracking of a semiconductor chip, passivation crack, and without impairing the reliability, by suppressing the warpage. Therefore, the present invention is suitable for a large size semiconductor device or a thin type encapsulation.

Synthesis Example 3 of Resin Compositions

Resin compositions 15 to 22 are prepared from the following raw materials:

(1) a first epoxy resin: YX-4000H (Yuka Shell Epoxy Co. Ltd.)

(2) a second epoxy resin: ESX-221 (Sumitomo Chemical Co., Ltd.)

(3) a third epoxy resin: ESCN-195XL (Surnitomo Chemical Co., Ltd.)

(4) a firstphenol resin: BRL-556 (ShowaKobunshi Co, Ltd.)

(5) a secondphenol resin: XL-225L (Mitsui Toatsu Chemicals, Inc.)

(6) a silane coupling agent: A-187 (Nihon Unka K.K.)

(7) a carbon black: CB-30 (Mitsubishi Chemicalindustries Ltd.)

(8) a first curing accelerator: triphenylphosphine (9) a second curing accelerator: C17Z (ShikokuKasei Co., Ltd.)

(10) a silicone gel: thermosetting type adduct silicone gel

(11) a MBS resin: an average particle diameter of 30 µm

(12) a mold releasing agent: an ester wax

(13) a flame retardant: an antimony trioxide

(14) an inorganic filler: GR-80AK (Toshiba Ceramics Co. Ltd.)

The resin compositions are made of the above-listed raw materials according to the ratio in parts by weight shown in Table 8 in the same manner as the synthesis example 1. The gelling time of the resin compositions is measured by using a hot plate at 180° C. and listed in Table 8.

Examples 17 to 22 and Comparative Examples 11 to 16

Encapsulating sheets are made of the above-mentioned resin compositions in the following manner. First, a resin sheet is produced by pressing into a desired thickness. Two different resin sheets are bonded together by pressing with heating so as to produce an encapsulating sheet having a thickness of 200 µm. The encapsulating sheet is cut in sizes of 5×15 mm for an active surface side and 7×17 mm for a bottom surface side. Table 9 shows the combination of the resin sheets used in each example. After that, encapsulation is carried out in the same manner as examples 11 to 16. A TAB type semiconductor chip of 5 mm×15 mm×200 µm is used and the resultant package size is 8 mm×18 mm×500 µm. The thickness of the upper layer and the lower layer of the encapsulant is 150 µm, respectively. Further, the thickness of each resin composition after curing is substaintially the same.

In Examples 17 to 22, the amount of the curing accelerator at the mold-side of the envcapsulation layer is larger than that at the chip-side. In Comparative examples 11 to 15, the amount of the curing accelerator at the mold-side is the same as that at the chip-side. In Comparative example 16. the amount of the curing accelerator of the mold side is smaller than that at the chip-side.

Table 10 shows the following properties of each example:

(1) Heat-shock resistance same as Examples 1 to 10;

(2) Moisture resistance same as Examples 1 to 10; and (3) Moldability

The moldability is evaluated by visually inspecting voids and short-shot, and described as percent defective of 20 samples.

TABLE 8

| resin composition No. | 15 | 16 | 17 | 18 | 19 | 20 | 21 | 22 |
| --- | --- | --- | --- | --- | --- | --- | --- | --- |
| 1st epoxy resin (YX-4000H) | 8.5 | 8.5 | 8.5 | 8.5 |  |  |  |  |
| 2nd epoxy resin (ESX-221) |  |  |  |  | 11.0 | 11.0 | 11.0 | 11.0 |
| 3rd epoxy resin (ESCN-195XL) | 2.1 | 2.1 | 2.1 | 2.1 |  |  |  |  |
| 1st phenol resin | 5.3 | 5.3 | 5.3 | 5.3 |  |  |  |  |

TABLE 8-continued

| resin composition No. | 15 | 16 | 17 | 18 | 19 | 20 | 21 | 22 |
|---|---|---|---|---|---|---|---|---|
| (BRL-556) 2nd phenol resin (XL-225L) | | | | | 4.9 | 4.9 | 4.9 | 4.9 |
| silane coupling agent (A-187) | 0.5 | 0.5 | 0.5 | 0.5 | 0.5 | 0.5 | 0.5 | 0.5 |
| carbon black (CB-30) | 0.3 | 0.3 | 0.3 | 0.3 | 0.3 | 0.3 | 0.3 | 0.3 |
| 1st curing accelerator (TPP) | | | | | 0.4 | 0.8 | 1.6 | 3.2 |
| 2nd curing accelerator (C17Z) | 0.2 | 0.4 | 0.8 | 1.6 | | | | |
| silicone gel | 1.0 | 1.0 | 1.0 | 1.0 | 1.0 | 1.0 | 1.0 | 1.0 |
| MBS resin | 1.5 | 1.5 | 1.5 | 1.5 | 1.5 | 1.5 | 1.5 | 1.5 |
| mold releasing agent | 0.4 | 0.4 | 0.4 | 0.4 | 0.4 | 0.4 | 0.4 | 0.4 |
| flame retardant | 2.0 | 2.0 | 2.0 | 2.0 | 2.0 | 2.0 | 2.0 | 2.0 |
| filler | 72.0 | 72.0 | 72.0 | 72.0 | 72.0 | 72.0 | 72.0 | 72.0 |
| gelling time (sec) | 45 | 25 | 14 | 9 | 48 | 27 | 16 | 11 |

TABLE 9

| | Example | | | | | | Comparative example | | | | | |
|---|---|---|---|---|---|---|---|---|---|---|---|---|
| | 17 | 18 | 19 | 20 | 21 | 22 | 11 | 12 | 13 | 16 | 15 | 16 |
| molding time (sec) | 20 | 30 | 50 | 20 | 50 | 30 | 20 | 30 | 50 | 20 | 50 | 30 |
| resin compostion No. on the mold side | 18 | 17 | 17 | 22 | 21 | 21 | 18 | 16 | 15 | 22 | 19 | 15 |
| resin composition No. on the chip side | 16 | 16 | 15 | 20 | 19 | 15 | 18 | 16 | 15 | 22 | 19 | 21 |

TABLE 10

| | Example | | | | | | Comparative example | | | | | |
|---|---|---|---|---|---|---|---|---|---|---|---|---|
| | 17 | 18 | 19 | 20 | 21 | 22 | 11 | 12 | 13 | 14 | 15 | 16 |
| TCT | | | | | | | | | | | | |
| 50 cycles | 0/20 | 0/20 | 0/20 | 0/20 | 0/20 | 0/20 | 0/20 | 0/20 | 0/20 | 1/20 | 2/20 | 5/20 |
| 100 cycles | 0/20 | 0/20 | 0/20 | 0/20 | 0/20 | 0/20 | 0/20 | 0/20 | 2/20 | 1/20 | 2/20 | 6/20 |
| 150 cycles | 0/20 | 0/20 | 0/20 | 0/20 | 0/20 | 0/20 | 2/20 | 3/20 | 6/20 | 4/20 | 3/20 | 12/20 |
| 300 cycles | 0/20 | 0/20 | 0/20 | 0/20 | 0/20 | 1/20 | 3/20 | 4/20 | 8/20 | 7/20 | 4/20 | 14/20 |
| 500 cycles | 0/20 | 0/20 | 0/20 | 0/20 | 0/20 | 1/20 | 4/20 | 7/20 | 9/20 | 11/20 | 6/20 | 15/20 |
| PCT | | | | | | | | | | | | |
| 100 h | 0/20 | 0/20 | 0/20 | 0/20 | 0/20 | 0/20 | 7/20 | 0/20 | 3/20 | 2/20 | 0/20 | 5/20 |
| 200 h | 0/20 | 0/20 | 0/20 | 0/20 | 0/20 | 0/20 | 8/20 | 0/20 | 3/20 | 4/20 | 0/20 | 5/20 |
| 300 h | 0/20 | 0/20 | 0/20 | 0/20 | 0/20 | 0/20 | 12/20 | 2/20 | 6/20 | 5/20 | 2/20 | 7/20 |
| 500 h | 0/20 | 0/20 | 0/20 | 1/20 | 0/20 | 1/20 | 14/20 | 2/20 | 7/20 | 9/20 | 3/20 | 12/20 |
| 1000 h | 0/20 | 2/20 | 0/20 | 2/20 | 1/20 | 3/20 | 18/20 | 4/20 | 7/20 | 12/20 | 3/20 | 16/20 |
| PCT after soldering | | | | | | | | | | | | |
| immediately after | 0/20 | 0/20 | 0/20 | 0/20 | 0/20 | 0/20 | 2/20 | 1/20 | 4/20 | 4/20 | 0/20 | 9/20 |
| 100 h | 0/20 | 0/20 | 0/20 | 0/20 | 0/20 | 0/20 | 7/20 | 1/20 | 4/20 | 4/20 | 0/20 | 12/20 |
| 200 h | 0/20 | 0/20 | 0/20 | 0/20 | 0/20 | 0/20 | 9/20 | 2/20 | 4/20 | 7/20 | 0/20 | 15/20 |
| 300 h | 0/20 | 0/20 | 0/20 | 0/20 | 0/20 | 1/20 | 15/20 | 3/20 | 5/20 | 9/20 | 1/20 | 16/20 |
| 500 h | 0/20 | 0/20 | 0/20 | 2/20 | 0/20 | 2/20 | 18/20 | 5/20 | 8/20 | 9/20 | 3/20 | 16/20 |
| 1000 h | 0/20 | 2/20 | 0/20 | 2/20 | 1/20 | 3/20 | 19/20 | 8/20 | 8/20 | 13/20 | 3/20 | 18/20 |
| Defective appearance | 0/20 | 0/20 | 0/20 | 0/20 | 0/20 | 0/20 | 1/20 | 15/20 | 17/20 | 2/20 | 17/20 | 20/20 |

The semiconductor devices in Examples 17 to 22 are superior to Comparative examples 11 to 16 in each property, especially in occurrence of crack after soldering. As a result, Examples 17 to 22 have a good reliability. Further, good appearances are obtained in Examples 17 to 22.

Therefore, the present invention can provide a semiconductor device without corrosion due to a residual curing accelerator, i.e., to have a good reliability without reducing productivity, because the concentration of the curing accelerator on the mold-side of the encapsulation is high and that of the chip-side is low.

Synthesis Example 4 of Resin Compositions

Resin compositions 23 to 32 are prepared from the following raw materials:

(1) a epoxy resin: ESX-221 (Sumitomo Chemical Co., Ltd.)
(2) a flame-retardant epoxy resin: AER-745 (Asahi Chemical Industry Co., Ltd.) a brominated epoxy resin
(3) a phenol resin: XL-225L (Mitsui Toatsu Chemicals, Inc.)
(4) a silane coupling agent: A-187 (Nihon Unka K.K.)
(5) a carbon black: CB-30 (Mitsubishi Chemical industries Ltd.)
(6) a curing accelerator: C17Z (Shikoku Kasei Co., Ltd.)
(7) a silicone gel: thermosetting type adduct silicone gel
(8) a MBS resin: an average particle diameter of 30 μm
(9) a mold releasing agent: an ester wax
(10) a first flame retardant: an antimony trioxide
(11) a second flame retardant: an ammonium phosphate
(12) a third flame retardant: an aluminum hydroxide
(13) an inorganic filler: GR-80AK (Toshiba Ceramics Co., Ltd.)

The resin compositions are made of the above-listed raw materials according to the ratio in parts by weight shown in Table 11 in the same manner as the synthesis example 1.

Examples 23 to 32 and Comparative Examples 17 to 22

Encapsulating sheets are made of the above-mentioned resin compositions in the following manner. First, a resin sheet is produced by pressing into a desired thickness. The resin sheets having a total thickness of 1200 μm are bonded together by pressing with heating so as to produce an encapsulating sheet having a thickness of 600 μm. The compositions are mixed at the boundary as shown in FIG. 4. Table 12 shows the combination of the resin sheets used in each encapsulating sheet. The encapsulating resin sheet is cut in sizes of 5×15 mm for an active surface side and 7×17 mm for a bottom surface side. After that, encapsulation is carried out in the same manner as Examples 11 to 16. A TAB type semiconductor chip having the size of 5 mm×15 mm×400 μm is used and the package size is 8 mm×18 mm×1350 μm. The thickness of the upper layer and the lower layer of the encapsulant is 475 μm, respectively. Further, the thickness ratio of a layer of each resin composition after curing is substantially the same before curing. Table 13 shows the combination of the resin sheets used in each example.

In Examples 23 to 26, the amount of the flame retardant at the outer surface of the encapsulant at the active surface side of the semiconductor device is larger than that at the inner surface; and the amount of the flame retardant at the outer surface of the encapsulant at the bottom surface side is the same as that at the inner surface. In Examples 27 to 32, the amount of the flame retardant at the outer surface of the encapsulant at the active surface side is larger than that at the inner surface; and the amount of the flame retardant at the outer surface of the encapsulant at the bottom surface side is larger than that at the inner surface. In Comparative example 17, the flame retardant is not included. In Comparative examples 18 to 22, the amount of the flame retardant at the outer surface of the encapsulant at the active surface side is the same as that at the inner surface; and the amount of the flame retardant at the outer surface of the encapsulant at the bottom surface side is the same as that at the inner surface.

Table 14 shows the following properties of each example:
(1) Heat-shock resistance same as Examples 1 to 10;
(2) Moisture resistance same as Examples 1 to 10; and
(3) Moisture resistance after IR reflow soldering The moisture resistance after IR reflow soldering is examined by the manner that after moisture absorption at 85° C. and 85% RH for 72 hours, samples are irradiated by infrared rays so as to be heated at 240° C. for 30 seconds, and described as percent cracking of 20 samples. Further, the samples are heated in a pressure cooker filled with saturated steam at 127° C. and 2.5 atm. The percent defective of 20 samples after 100 to 1000 hours is shown in Table 14.

(4) Flame retardance

The flame retardance is measured according to UL-94 which is the United States standard.

TABLE 11

| resin composition No. | 23 | 24 | 25 | 26 | 27 | 28 | 29 | 30 | 31 | 32 |
|---|---|---|---|---|---|---|---|---|---|---|
| epoxy resin (ESX-221) | 14.0 | 14.0 | 7.0 | 10.0 | 7.0 | 5.0 | 12.0 | 10.0 | 12.0 | 10.0 |
| flame retardent epoxy resin (AER-745) | | | 2.0 | 4.0 | 7.0 | 9.0 | 2.0 | 4.0 | 2.0 | 4.0 |
| phenol resin (XL-225L) | 7.9 | 7.9 | 7.9 | 7.9 | 7.9 | 7.9 | 7.9 | 7.9 | 7.9 | 7.9 |
| silane coupling agent (A-187) | 0.5 | 0.5 | 0.5 | 0.5 | 0.5 | 0.5 | 0.5 | 0.5 | 0.5 | 0.5 |
| carbon black (CB-30) | 0.3 | 0.3 | 0.3 | 0.3 | 0.3 | 0.3 | 0.3 | 0.3 | 0.3 | 0.3 |
| curing accelerator (C17Z) | 0.4 | 0.4 | 0.4 | 0.4 | 0.4 | 0.4 | 0.4 | 0.4 | 0.4 | 0.4 |
| silicone gel | 1.0 | 1.0 | 1.0 | 1.0 | 1.0 | 1.0 | 1.0 | 1.0 | 1.0 | 1.0 |
| MBS resin | 1.5 | 1.5 | 1.5 | 1.5 | 1.5 | 1.5 | 1.5 | 1.5 | 1.5 | 1.5 |
| mold releasing agent | 0.4 | 0.4 | 0.4 | 0.4 | 0.4 | 0.4 | 0.4 | 0.4 | 0.4 | 0.4 |
| 1st flame retardant ($Sb_2O_3$) | | 1.0 | 2.0 | 2.0 | 2.0 | 2.0 | | | | |
| 2nd flame retardant (($NH_4$)$_2PO_4$) | | | | | | | 2.0 | 4.0 | | |
| 3rd flame retardant (Al(OH)$_3$) | | | | | | | | | 30.0 | 50.0 |
| filler | 74.0 | 73.0 | 72.0 | 72.0 | 72.0 | 72.0 | 72.0 | 70.0 | 44.0 | 24.0 |

TABLE 12

| Resin Sheet No. | 1 | 2 | 3 | 4 | 5 | 6 | 7 | 8 | 9 | 10 |
|---|---|---|---|---|---|---|---|---|---|---|
| chip side | | | | | | | | | | |
| resin composition No. | 23 | 23 | 23 | 24 | 24 | 24 | 23 | 23 | 23 | 23 |
| Thickness (μm) | 50 | 50 | 100 | 100 | 100 | 100 | 100 | 100 | 100 | 100 |

TABLE 12-continued

| resin composition No. | 24 | 24 | 26 | 26 | 27 | 28 | 29 | 30 | 31 | 32 |
|---|---|---|---|---|---|---|---|---|---|---|
| Thickness (μm) | 400 | 750 | 1100 | 1100 | 1100 | 1100 | 1100 | 1100 | 1100 | 1100 |
| Combination of resin sheets | | | | | | | | | | |
| rersin composition No. | 25 | 26 | — | — | — | — | — | — | — | — |
| Thickness (μm) | 400 | 300 | | | | | | | | |
| resin composition No. | 26 | — | — | — | — | — | — | — | — | — |
| Thickness (μm) | 350 | | | | | | | | | |

| resin sheet No. | 11 | 12 | 13 | 14 | 15 | 16 |
|---|---|---|---|---|---|---|
| resin composition No. | 23 | 24 | 26 | 28 | 30 | 32 |
| Thicknesses (μm) | 1200 | 1200 | 1200 | 1200 | 1200 | 1200 |

TABLE 13

| Combination of resin sheets | Example | | | | | | | | | |
|---|---|---|---|---|---|---|---|---|---|---|
| | 23 | 24 | 25 | 26 | 27 | 28 | 29 | 30 | 31 | 32 |
| Resin sheet No. on the active side | 1 | 2 | 3 | 4 | 5 | 6 | 7 | 8 | 9 | 10 |
| Resin sheet No. on the bottom side | 12 | 12 | 12 | 12 | 5 | 6 | 7 | 8 | 9 | 10 |

| Combination of resin sheets | Comparative Example | | | | | |
|---|---|---|---|---|---|---|
| | 17 | 18 | 19 | 20 | 21 | 22 |
| resin sheet No. on the active side | 11 | 12 | 13 | 14 | 15 | 16 |
| resin sheet No. on the bottom side | 11 | 12 | 13 | 14 | 15 | 16 |

Therefore, the present invention can provide a semiconductor device having a good reliability without reducing flame retardance due to the distribution changing of the flame retardant, i.e., the concentration of the flame retardant on the mold side is high and that of the chip side, especially the active surface, is low.

Examples 33 to 37 and Comparative Examples 23 to 24

In Examples 33 to 37, the region of the encapsulant contacting a semiconductor chip is composed of a sheet which does not contain flame retardants and made by the method as FIG. 3 using resin sheets described in Table 15 where the sheet numbers correspond to Table 12. Two identical uncured resin sheets are bonded and cured such that the region which does not contain flame retardants is covered by the layer which contains flame retardants. In

TABLE 14

| | Example | | | | | | | | | | Comparative Example | | | | | |
|---|---|---|---|---|---|---|---|---|---|---|---|---|---|---|---|---|
| | 23 | 24 | 25 | 26 | 27 | 28 | 29 | 30 | 31 | 32 | 17 | 18 | 19 | 20 | 21 | 22 |
| TCT | | | | | | | | | | | | | | | | |
| 100 cycles | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 |
| 200 cycles | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 |
| 300 cycles | 0/20 | 0/20 | 0/20 | 0/20 | 0/20 | 0/20 | 0/20 | 0/20 | 0/20 | 0/20 | 0/20 | 0/20 | 0/20 | 2/20 | 1/20 | 2/20 |
| 500 cycles | 0/20 | 0/20 | 1/20 | 1/20 | 0/20 | 0/20 | 0/20 | 0/20 | 0/20 | 0/20 | 0/20 | 1/20 | 2/20 | 3/20 | 3/20 | 2/20 |
| 1000 cycles | 0/20 | 0/20 | 0/20 | 2/20 | 2/20 | 0/20 | 0/20 | 0/20 | 0/20 | 1/20 | 0/20 | 2/20 | 3/20 | 3/20 | 3/20 | 3/20 |
| PCT | | | | | | | | | | | | | | | | |
| 100 hours | 0/20 | 0/20 | 0/20 | 0/20 | 0/20 | 0/20 | 0/20 | 0/20 | 0/20 | 0/20 | 0/20 | 0/20 | 1/20 | 0/20 | 0/20 | 2/20 |
| 200 hours | 0/20 | 0/20 | 0/20 | 0/20 | 0/20 | 0/20 | 0/20 | 0/20 | 0/20 | 0/20 | 0/20 | 0/20 | 1/20 | 0/20 | 0/20 | 3/20 |
| 300 hours | 0/20 | 0/20 | 0/20 | 0/20 | 0/20 | 0/20 | 0/20 | 0/20 | 0/20 | 0/20 | 0/20 | 0/20 | 2/20 | 2/20 | 1/20 | 3/20 |
| 500 hours | 0/20 | 0/20 | 0/20 | 1/20 | 1/20 | 0/20 | 0/20 | 0/20 | 0/20 | 0/20 | 0/20 | 1/20 | 3/20 | 2/20 | 2/20 | 5/20 |
| 1000 hours | 0/20 | 0/20 | 0/20 | 1/20 | 2/20 | 0/20 | 0/20 | 0/20 | 0/20 | 1/20 | 0/20 | 1/20 | 3/20 | 4/20 | 3/20 | 6/20 |
| PCT after soldering | | | | | | | | | | | | | | | | |
| Immediately after | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 | 0/20 |
| 100 hours | 0/20 | 0/20 | 0/20 | 0/20 | 0/20 | 0/20 | 0/20 | 0/20 | 0/20 | 0/20 | 0/20 | 0/20 | 2/20 | 0/20 | 1/20 | 2/20 |
| 200 hours | 0/20 | 0/20 | 0/20 | 0/20 | 0/20 | 0/20 | 0/20 | 0/20 | 0/20 | 0/20 | 0/20 | 0/20 | 3/20 | 1/20 | 3/20 | 3/20 |
| 300 hours | 0/20 | 0/20 | 0/20 | 0/20 | 0/20 | 0/20 | 0/20 | 0/20 | 0/20 | 0/20 | 0/20 | 1/20 | 3/20 | 2/20 | 4/20 | 4/20 |
| 400 hours | 0/20 | 0/20 | 0/20 | 2/20 | 2/20 | 0/20 | 0/20 | 0/20 | 0/20 | 0/20 | 0/20 | 2/20 | 4/20 | 3/20 | 5/20 | 7/20 |
| 1000 hours | 0/20 | 0/20 | 0/20 | 3/20 | 2/20 | 0/20 | 1/20 | 0/20 | 1/20 | 2/10 | 0/20 | 3/20 | 6/20 | 5/20 | 7/20 | 9/20 |
| Flame retardance test (UL-94) | V-0 | V-0 | V-0 | V-0 | V-0 | V-0 | V-0 | V-0 | V-0 | V-0 | V-2 | V-1 | V-1 | V-0 | V-0 | V-0 |

The semiconductor devices in Examples 23 to 32 are superior in each property. Comparative examples 18 to 22 are inferior in reliability. Comparative example 17 is inferior in flame retardance.

Comparative example 23, two resin sheets of No. 11 are bonded and cured such that the cured resultant resin sheet does not contain a flame retardant. In comparative example 24, two resin sheets of No. 14 are bonded and cured such that the cured resultant resin sheet contains a flame retardant through the sheet uniformly. As shown in Table 15, the flame retardance of cured resin sheets is examined with a Hot Wire Ignition test in the following manner. A cured resin sheet is wound with a resistance wire (B&S gauge No. 24, the composition of Cr 20 wt % and Ni 80 wt %, 0.0201" in diameter, 161 Ω/ft., 865 ft/lb. ). The number of turns of the wire is five and the interval is ¼". The wire is supplied with 65 W. The time to ignition is then measured.

TABLE 15

|  | Example 33 | Example 34 | Example 35 | Example 36 | Example 37 | Comparative Example 23 | Comparative Example 24 |
| --- | --- | --- | --- | --- | --- | --- | --- |
| Text piece | Sheet 1 | Sheet 2 | Sheet 3 | Sheet 4 | Sheet 5 | Sheet 11 | Sheet 14 |
| Time to ignition | 3 minutes | 3 minutes | 4 minutes | No ignition | No ignition | 17 seconds | No ignition |

Comparative example 23 without flame retardants indicates a poor flame retardance. Examples 33 to 37 are superior to Comparative example 23 in flame retardance. Especially, Examples 33 to 35 are equal to Comparative example 24, which contains flame retardances through the sheet.

As a result, the present invention can provide a semiconductor device having a good flame retardance and a good reliability with a reduced amount of flame retardants, because the amount of flame retardants is large at the outer side of the device and is small or "zero" at the inner side, i.e., chip surface.

Synthesis Example 5 of Resin Compositions

Resin compositions 33 to 40 are prepared from the following raw materials:

(1) an epoxy resin: ESX-221 (Sumitomo Chemical Co., Ltd.)

(2) a flame-retardant epoxy resin: AER-745 (Asahi Chemical Industry Co., Ltd. )

(3) a phenol resin: XL-225L (Mitsui Toatsu Chemicals, Inc.)

(4) a silane coupling agent: A-187 (Nihon Unka K.K.)

(5) a carbon black: CB-30 (Mitsubishi Chemical Industries Ltd.)

(6) a curing accelerator: C17Z (Shikoku Kasei Co.,Ltd.)

(7) a silicone gel: thermosetting type adduct silicone gel (8) a MBS resin: an average particle diameter of 30 μm (9) a mold releasing agent: an ester wax

(10) a flame retardant: an antimony trioxide

(11) a first inorganic filler: GR-80T (Toshiba Ceramics Co., Ltd.) crushed silica average particle diameter of 22 μm

(12) a second inorganic silica: SGA (Toshiba Ceramics Co., Ltd.) crushed silica average particle diameter of 5 μm

(13) a third inorganic filler: USS-80 (Toshiba Ceramics Co., Ltd.)
crushed silica
average particle diameter of 20 μm
low α-ray filler

(14) a fourth inorganic filler: USG-5A (Toshiba Ceramics Co., Ltd.)
crushed silica
average particle diameter of 10 μm
low α-ray filler

(15) a fifth inorganic filler: FB-5S (Denki Kagaku Kogyo K.K.)
spherical silica
average particle diameter of 6 μm

(16) a sixth inorganic filler: glass fiber
average diameter of 10 μm
average length of 60 μm

(17) a seventh inorganic filler: a bonded mica flake a moisture impermeable thin film The resin compositions are made of the above-listed raw materials according to the ratio in parts by weight shown in Table 16 in the same manner as the synthesis example 1.

Examples 38 to 49 and Comparative Examples 25 to 36

Encapsulating sheets are made of the above-mentioned resin compositions in the following manner. First, a resin sheet is produced by pressing into a desired thickness. The resin sheets having a total thickness of 400 μm are bonded together by pressing with heating so as to produce an encapsulating sheet having a thickness of 300 μm. The compositions are mixed at the boundary as shown in FIG. 4. Table 17 shows the combination of the resin sheets used in each encapsulating sheet. The encapsulating sheet is cut in sizes of 5×15 mm for an active surface side and 7×17 mm for a bottom surface side. After that, encapsulation is carried out in the same manner as Examples 11 to 16. A TAB type semiconductor chip having the size of 5 mm×15 mm×400 μm is used and the resultant package size is 8 mm×18 mm×900 μm. The thickness of the upper layer and the lower layer of the encapsulant is 250 μm, respectively. Further, the thickness ratio of a layer of each resin composition after curing is substantially the same before curing. Table 18 shows the combination of the resin sheets used in each example.

Example 38 is different from Comparative example 25 in the amount of fillers at both chip surfaces, i.e. the amount in Example 38 is smaller than that of Comparative example 25. Further, Example 38 is different from Comparative example 26 in the amount of fillers at the outer surface, i.e. the amount in Example 38 is larger than that of Comparative example 26. Example 39 is different from Comparative example 25 in the amount of fillers at the active surface, i.e., the amount in Example 39 is smaller than that of Comparative example 25. Further, Example 39 is different from Comparative example 26 in the amount of fillers at the outer surface, i.e., the amount in Example 38 is larger than that of Comparative example 26.

Example 40 is different from Comparative example 27 in the type of fillers at both chip surfaces, i.e., spherical in Example 40 and crushed in Comparative example 27. Further, Example 40 is different from Comparative example 28 in the type of fillers at the outer surface, i.e. crushed in Example 40 and spherical in Comparative example 28.

Example 41 is different from Comparative example 27 in the amount of fillers at the active surface, i.e., spherical in Example 41 and crushed in Comparative example 27. Further, Example 41 is different from Comparative example 28 in the type of fillers at the outer surface, i.e., crushed in Example 41 and spherical in Comparative example 28.

Example 42 is different from Comparative example 29 in the type of fillers at both surfaces, i.e. low α-ray type in Example 42 and general type in Comparative example 29. Further, Example 42 is different from Comparative example 30 in the type of fillers at the outer surface, i.e. general type in Example 42 and low α-ray type in Comparative example 30. Example 43 is different from Comparative example 29 in the type of fillers at the active surface, i.e. low α-ray type in Example 43 and general type in Comparative example 29. Further, Example 43 is different from Comparative example 30 in the type of fillers at the outer surface, i.e. general type in Example 43 and low α-ray type in Comparative example 30. Example 44 is different from Comparative example 31 in the average diameter of fillers at both surfaces of the chip, i.e. the diameter in Example 44 is smaller than that in Comparative example 31. Further, Example 44 is different from Comparative example 32 in the average diameter of fillers at the outer surface of the device, i.e. the diameter in Example 44 is larger than that in Comparative example 32. Example 45 is different from Comparative example 31 in the average diameter of fillers at the active surface of the chip, i.e. the diameter in Example 45 is smaller than that in Comparative example 31. Further, Example 45 is different from Comparative example 32 in the average diameter of fillers at the outer surface of the device, i.e. the diameter in Example 45 is larger than that in Comparative example 32.

Example 46 is different from Comparative example 33 in the type of fillers at both surfaces of the chip, i.e. crushed type in Example 46 and fiber type in Comparative example 33. Further, Example 46 is different from Comparative example 34 in the type of fillers at the outer surface of the device, i.e. fiber type in Example 46 and crushed type in Comparative example 34. Example 47 is different from Comparative example 33 in the type of fillers at the active surface, i.e., crushed type in Example 47 and fiber type in Comparative example 33. Further, Example 47 is different from Comparative example 34 in the type of fillers at the outer surface, i.e., fiber type in Example 47 and crushed type in Comparative example 34.

Example 48 is different from Comparative example 35 in the type of fillers at both surfaces of the chip, i.e., crushed type in Example 48 and moisture impermeable thin film type in Comparative example 35. Further, Example 48 is different from Comparative example 36 in the type of fillers at the outer surface of the device, i.e. moisture impermeable thin film type in Example 48 and crushed type in Comparative example 36. Example 49 is different from Comparative example 35 in the type of fillers at the active surface, i.e., crushed type in Example 49 and moisture impermeable thin film type in Comparative example 35. Further, Example 49 is different from Comparative example 36 in the type of fillers at the outer surface of the device, i.e. moisture impermeable thin film type in Example 49 and crushed type in Comparative example 36. Tables 19 to 22 show the following properties of each example:

(1) Heat-shock resistance same as Examples 1 to 10;
(2) Moisture resistance same as Examples 1 to 10;
(3) Moisture resistance after IR reflow soldering same as Examples 23 to 32

(4) Flash length

The flash length is measured after molding where the mold clearances are adjusted to 8 μm and 15 μm.

(5) Memory operating test

The chip of 4M DRAM is used and an occurrence of an error caused by irradiation of α-ray is measured.

TABLE 16

| resin - composition No. | 33 | 34 | 35 | 36 | 37 | 38 | 39 | 40 |
|---|---|---|---|---|---|---|---|---|
| epoxy resin (ESX-221) | 6.5 | 10.0 | 10.0 | 10.0 | 10.0 | 10.0 | 10.0 | 10.0 |
| Flame retardant epoxy resin (AER-745) | 2.5 | 4.0 | 4.0 | 4.0 | 4.0 | 4.0 | 4.0 | 4.0 |
| Phenol resin (XL-225L) | 4.9 | 7.9 | 7.9 | 7.9 | 7.9 | 7.9 | 7.9 | 7.9 |
| Silane coupling agent (A-187) | 0.5 | 0.5 | 0.5 | 0.5 | 0.5 | 0.5 | 0.5 | 0.5 |
| carbon (CB30) | 0.3 | 0.3 | 0.3 | 0.3 | 0.3 | 0.3 | 0.3 | 0.3 |
| Curing accerlerator (C17Z) | 0.4 | 0.4 | 0.4 | 0.4 | 0.4 | 0.4 | 0.4 | 0.4 |
| Silicone gel | 1.0 | 1.0 | 1.0 | 1.0 | 1.0 | 1.0 | 1.0 | 1.0 |
| MBS resin | 1.5 | 1.5 | 1.5 | 1.5 | 1.5 | 1.5 | 1.5 | 1.5 |
| Mold releasing agent | 0.4 | 0.4 | 0.4 | 0.4 | 0.4 | 0.4 | 0.4 | 0.4 |
| Flame retardant (antimony trioxide) | 2.0 | 2.0 | 2.0 | 2.0 | 2.0 | 2.0 | 2.0 | 2.0 |
| 1st filler (GR-80T), crusted, 22 μm | 80.0 | 72.0 | | 65.0 | | | 50.0 | 50.0 |
| 2nd filler (SGA), crushed, 5 μm | | | 72.0 | 7.0 | | | | |
| 3rd filler (USS-80) low-a-ray, 20 μm | | | | | 65.0 | | | |
| 4th filler (USG-5A), low-a-ray, 10 μm | | | | | 7.0 | | | |
| 5th filler (FB-55), spherical, 6 μm | | | | | | 72.0 | | |
| 6th filler (REVX2008), fibrous | | | | | | | 22.0 | |
| 7th filler (mica), flaky | | | | | | | | 22.0 |

TABLE 17

| Sheet 1 | Sheet 2 | Sheet 3 | Sheet 4 | Sheet 5 | Sheet 6 |
|---|---|---|---|---|---|
| resin composition 33 200 μm | resin composition 35 200 μm | resin composition 36 250 μm | regin composition 34 250 μm | resin composition 39 200 μm | resin composition 40 150 μm |
| resin composition 34 200 μm | resin composition 38 200 μm | resin composition 37 150 μm | resin composition 35 150 μm | resin composition 36 200 μm | resin composition 36 250 μm |

| Sheet 11 | Sheet 12 | Sheet 13 | Sheet 14 | Sheet 15 | Sheet 16 | Sheet 17 | Sheet 18 |
|---|---|---|---|---|---|---|---|
| resin composition 33 400 μm | resin composition 34 400 μm | resin composition 35 400 μm | resin composition 36 400 μm | resin composition 37 400 μm | resin composition 38 400 μm | resin composition 39 400 μm | resin composition 40 400 μm |

TABLE 18

|  | Example 38 | Example 40 | Example 42 | Example 44 | Example 46 | Example 48 |
|---|---|---|---|---|---|---|
| Active side | Sheet 1 | Sheet 2 | Sheet 3 | Sheet 4 | Sheet 5 | Sheet 6 |
| Bottom side | Sheet 1 | Sheet 2 | Sheet 3 | Sheet 4 | Sheet 5 | Sheet 6 |

|  | Example 39 | Example 41 | Example 43 | Example 45 | Example 47 | Example 49 |
|---|---|---|---|---|---|---|
| Active side | Sheet 1 | Sheet 2 | Sheet 3 | Sheet 4 | Sheet 5 | Sheet 6 |
| Bottom side | Sheet 11 | Sheet 13 | Sheet 14 | Sheet 12 | Sheet 17 | Sheet 18 |

|  | Comparative Example 25 | Comparative Example 27 | Comparative Example 29 | Comparative Example 31 | Comparative Example 33 | Comparative Example 35 |
|---|---|---|---|---|---|---|
| Active side | Sheet 11 | Sheet 13 | Sheet 14 | Sheet 12 | Sheet 17 | Sheet 18 |
| Bottom side | Sheet 11 | Sheet 13 | Sheet 14 | Sheet 12 | Sheet 17 | Sheet 18 |

|  | Comparative Example 26 | Comparative Example 28 | Comparative Example 30 | Comparative Example 32 | Comparative Example 34 | Comparative Example 36 |
|---|---|---|---|---|---|---|
| Active side | Sheet 12 | Sheet 16 | Sheet 15 | Sheet 13 | Sheet 14 | Sheet 14 |
| Bottom side | Sheet 12 | Sheet 16 | Sheet 15 | Sheet 13 | Sheet 14 | Sheet 14 |

TABLE 19

|  | Example |  |  |  |  |  |  |  |  |  |  |  |
|---|---|---|---|---|---|---|---|---|---|---|---|---|
|  | 38 | 39 | 40 | 41 | 42 | 43 | 44 | 45 | 46 | 47 | 48 | 49 |
| TCT |  |  |  |  |  |  |  |  |  |  |  |  |
| 500 cycles | 3/20 | 3/20 | 0/20 | 0/20 | 2/20 | 2/20 | 1/20 | 1/20 | 2/20 | 2/20 | 2/20 | 2/20 |
| 1000 cycles | 3/20 | 3/20 | 3/20 | 3/20 | 3/20 | 3/20 | 1/20 | 1/20 | 2/20 | 2/20 | 3/20 | 3/20 |
| 1500 cycles | 3/20 | 3/20 | 6/20 | 6/20 | 4/20 | 4/20 | 2/20 | 2/20 | 2/20 | 2/20 | 4/20 | 4/20 |
| 2500 cycles | 3/20 | 3/20 | 9/20 | 9/20 | 5/20 | 5/20 | 2/20 | 2/20 | 2/20 | 2/20 | 5/20 | 5/20 |
| 5000 cycles | 3/20 | 3/20 | 12/20 | 12/20 | 6/20 | 6/20 | 3/20 | 3/20 | 2/20 | 2/20 | 6/20 | 6/20 |
| PCT |  |  |  |  |  |  |  |  |  |  |  |  |
| 500 hours | 3/20 | 3/20 | 0/20 | 0/20 | 2/20 | 2/20 | 1/20 | 1/20 | 2/20 | 2/20 | 2/20 | 2/20 |
| 1000 hours | 3/20 | 3/20 | 1/20 | 1/20 | 3/20 | 3/20 | 2/20 | 2/20 | 3/20 | 3/20 | 2/20 | 2/20 |
| 1500 hours | 4/20 | 4/20 | 2/20 | 2/20 | 4/20 | 4/20 | 3/20 | 3/20 | 4/20 | 4/20 | 2/20 | 2/20 |
| 2500 hours | 4/20 | 4/20 | 3/20 | 3/20 | 5/20 | 5/20 | 4/20 | 4/20 | 5/20 | 5/20 | 2/20 | 2/20 |
| 5000 hours | 5/20 | 5/20 | 4/20 | 4/20 | 6/20 | 6/20 | 5/20 | 5/20 | 6/20 | 6/20 | 2/20 | 2/20 |
| PCT after Soldering |  |  |  |  |  |  |  |  |  |  |  |  |
| Immediately after | 3/20 | 3/20 | 3/20 | 3/20 | 4/20 | 4/20 | 2/20 | 2/20 | 2/20 | 2/20 | 4/20 | 4/20 |
| 500 hours | 3/20 | 3/20 | 3/20 | 3/20 | 4/20 | 4/20 | 2/20 | 2/20 | 2/20 | 2/20 | 4/20 | 4/20 |
| 1000 hours | 3/20 | 3/20 | 4/20 | 4/20 | 5/20 | 5/20 | 3/20 | 3/20 | 3/20 | 3/20 | 4/20 | 4/20 |
| 1500 hours | 4/20 | 4/20 | 5/20 | 5/20 | 6/20 | 6/20 | 4/20 | 4/20 | 4/20 | 4/20 | 4/20 | 4/20 |
| 2500 hours | 4/20 | 4/20 | 6/20 | 6/20 | 7/20 | 7/20 | 5/20 | 5/20 | 5/20 | 5/20 | 4/20 | 4/20 |
| 5000 hours | 5/20 | 4/20 | 7/20 | 6/20 | 8/20 | 7/20 | 6/20 | 5/20 | 6/20 | 5/20 | 5/20 | 4/20 |

TABLE 20

| | Comparative Example | | | | | | | | | | | |
|---|---|---|---|---|---|---|---|---|---|---|---|---|
| | 25 | 26 | 27 | 28 | 29 | 30 | 31 | 32 | 33 | 34 | 35 | 36 |
| TCT | | | | | | | | | | | | |
| 500 cycles | 5/20 | 3/20 | 1/20 | 5/20 | 2/20 | 2/20 | 3/20 | 1/20 | 3/20 | 2/20 | 3/20 | 2/20 |
| 1000 cycles | 5/20 | 3/20 | 4/20 | 10/20 | 3/20 | 3/20 | 3/20 | 4/20 | 3/20 | 3/20 | 4/20 | 3/20 |
| 1500 cycles | 5/20 | 4/20 | 7/20 | 15/20 | 4/20 | 4/20 | 4/20 | 7/20 | 3/20 | 4/20 | 5/20 | 4/20 |
| 2500 cycles | 5/20 | 4/20 | 10/20 | 20/20 | 5/20 | 5/20 | 4/20 | 10/20 | 3/20 | 5/20 | 6/20 | 5/20 |
| 5000 cycles | 5/20 | 5/20 | 13/20 | 20/20 | 6/20 | 6/20 | 5/20 | 13/20 | 3/20 | 6/20 | 7/20 | 6/20 |
| PCT | | | | | | | | | | | | |
| 500 hours | 5/20 | 3/20 | 1/20 | 0/20 | 2/20 | 2/20 | 3/20 | 1/20 | 3/20 | 2/20 | 3/20 | 2/20 |
| 1000 hours | 5/20 | 4/20 | 2/20 | 1/20 | 3/20 | 3/20 | 4/20 | 2/20 | 6/20 | 3/20 | 3/20 | 3/20 |
| 1500 hours | 6/20 | 5/20 | 3/20 | 3/20 | 4/20 | 4/20 | 5/20 | 3/20 | 9/20 | 4/20 | 3/20 | 4/20 |
| 2500 hours | 6/20 | 6/20 | 4/20 | 3/20 | 5/20 | 5/20 | 6/20 | 4/20 | 12/20 | 5/20 | 3/20 | 5/20 |
| 5000 hours | 7/20 | 7/20 | 5/20 | 4/20 | 6/20 | 6/20 | 7/20 | 5/20 | 15/20 | 6/20 | 3/20 | 6/20 |
| PCT after soldering | | | | | | | | | | | | |
| Immediately after | 5/20 | 4/20 | 4/20 | 5/20 | 4/20 | 4/20 | 4/20 | 4/20 | 3/20 | 4/20 | 5/20 | 4/20 |
| 500 hours | 5/20 | 4/20 | 4/20 | 5/20 | 4/20 | 4/20 | 4/20 | 4/20 | 3/20 | 4/20 | 5/20 | 4/20 |
| 1000 hours | 5/20 | 5/20 | 5/20 | 6/20 | 5/20 | 5/20 | 5/20 | 5/20 | 6/20 | 5/20 | 5/20 | 5/20 |
| 1500 hours | 6/20 | 6/20 | 5/20 | 7/20 | 6/20 | 6/20 | 6/20 | 6/20 | 9/20 | 6/20 | 5/20 | 6/20 |
| 2500 hours | 6/20 | 7/20 | 7/20 | 8/20 | 7/20 | 7/20 | 7/20 | 7/20 | 12/20 | 7/20 | 5/20 | 7/20 |
| 5000 hours | 7/20 | 8/20 | 8/20 | 9/20 | 8/20 | 8/20 | 8/20 | 8/20 | 15/20 | 8/20 | 5/20 | 8/20 |

TABLE 21

| | Example | | | | Comparative Example | | | |
|---|---|---|---|---|---|---|---|---|
| | 40 | 41 | 44 | 45 | 27 | 28 | 31 | 32 |
| Flash length (8 μm gap) | 0.5 mm | 0.4 mm | 0.1 mm | 0.1 mm | 0.4 mm | 2.7 mm | 0.1 mm | 0.5 mm |
| Flash length (15 μm gap) | 1.1 mm | 0.9 mm | 0.1 mm | 0.2 mm | 1.0 mm | 5.5 mm | 0.1 mm | 1.1 mm |

TABLE 22

| | Example | | Comparative Example | |
|---|---|---|---|---|
| | 42 | 30 | 29 | 30 |
| the ratio of price of filler in 1 kg of resin sheets | 217 | 158 | 100 | 333 |
| Memory operation test | Good | Good | Poor | Good |

The semiconductor devices in Examples 38 and 39 are superior to Comparative examples 25 and 26 in Heat-shock resistance, Moisture resistance, and Moisture resistance after IR reflow soldering. Because Comparative example 25 contains a larger amount of fillers at the active surface of the chip than Examples 38 to 39, the possibility of damages to the chip is high. Further, because Comparative example 26 has a smaller amount of fillers at the outer surface of the device than Examples 38 and 39, the amount of absorption of water is large. Therefore, Comparative examples 25 and 26 are inferior in reliability.

The semiconductor devices in Examples 40 and 41 are superior to Comparative examples 27 and 28 in Heat-shock resistance, Moisture resistance and Moisture resistance after IR reflow soldering. Because Comparative examples 27 contains crushed fillers at the active surface of the chip, the possibility of damages to the chip is high. Further, because Comparative example 28 contains spherical fillers at the outer surface of the device, the strength of the device is reduced as compared with Examples 40 and 41. Therefore, Comparative examples 27 and 28 are inferior in reliability. Furthermore, in Comparative example 28, the length of the flash is longer than Examples 40 and 41.

The semiconductor devices in Examples 42 and 43 are superior to Comparative example 29 in reliability against irradiating α-ray caused by fillers. Because Comparative example 29 contains fillers not reduced of U or Th at the active surface of the chip, the possibility of error caused by α-ray is high. Further, since Comparative example 30 contains larger amount of fillers reduced of U and Th, i.e. expensive fillers, the cost is higher than Examples 42 and 43. Therefore, Examples 42 and 43 can have a high reliability against irradiating α-ray caused by fillers with low cost.

The semiconductor devices in Examples 44 and 45 are superior to Comparative examples 31 and 32 in reliability. Because Comparative example 31 contains large diameter fillers at the active surface of the chip, the possibility of damages to the chip is high. Further, because Comparative example 32 contains small diameter fillers at the outer surface of the device, the strength of the device is reduced as compared with Examples 44 and 45. Therefore, Comparative examples 31 and 32 are inferior in reliability. Furthermore, in Comparative example 32, the amount of the flash is larger than Examples 44 and 45.

The semiconductor devices in Examples 46 and 47 are superior to Comparative examples 33 and 34 in reliability. Because Comparative example 33 contains large amount of glass fiber fillers at the active surface of the chip, contaminations from the fillers cause damage to the chip. Further, because Comparative example 34 does not contain fiber type fillers at the outer surface of the device, the strength of the device is reduced as compared with Examples 46 and 47. Therefore, Comparative examples 33 and 34 are inferior in reliability.

The semiconductor devices in Examples 48 and 49 are superior to Comparative examples 35 and 36 in reliability. Because Comparative example 35 contains large amount of flake fillers at the active surface of the chip, the possibility of damage to the chip is high. Further, because Comparative example 36 does not contain flake fillers at the outer surface of the device, the amount of absorption of water is larger than Examples 48 and 49. Therefore, Comparative examples 35 and 36 are inferior in reliability.

Synthesis Example 6 of Resin Compositions

Resin compositions 41 to 50 are prepared from the following raw materials:

(1) a first epoxy resin: YX-4000H (Yuka Shell Epoxy Co., Ltd.)
(2) a second epoxy resin: ESX-221 (Sumitomo Chemical Co., Ltd.)
(3) a third epoxy resin: GY-260 (Ciba-Geigy Corp.) bisphenol A type epoxy resin
(4) a fourth epoxy resin: ESCN-195XL (Sumitomo Chemical Co., Ltd.)
(5) a fifth epoxy resin: triglycidyl isocyanurate
(6) a first phenol resin: BRL-556 (Showa Kobunshi Co., Ltd.)
(7) a second phenol resin: XL-225L (Mitsui Toatsu Chemicals, Inc.)
(8) an acid anhydride: THPA
(9) a silane coupling agent: A-187 (Nihon Unka K.K.)
(10) a first colorant: carbon black CB-30 (Mitsubishi Chemical Industries Ltd.)
(11) a second colorant: $TiO_2$
(12) a third colorant: oil black azo black organic dye (Ciba-Geigy Corp.)
(13) a forth colorant: cadmium yellow CdS+ZnS
(14) a fifth colorant: red iron oxide $Fe_2O_3$
(15) a sixth colorant: $K_4Fe[Fe(CN)_6]$
(16) a seventh colorant: cobalt green CoO+ZnO
(17) a curing accelerator: C17Z (Shikoku Kasei Co., Ltd.)
(18) a silicone gel: thermosetting type adduct silicone gel
(19) a MBS resin: an average particle diameter of 30 μm
(20) a mold releasing agent: an ester wax
(21) a flame retardant: an antimony trioxide
(22) an inorganic filler: GR-80AK (Toshiba Ceramics Co., Ltd.)

The resin compositions are made of the above-listed raw materials according to the ratio in parts by weight shown in Table 23 in the same manner as the synthesis example 1.

Examples 50 to 58 and Comparative Examples 37 to 42

Encapsulating sheets are made of the above-mentioned resin compositions in the same manner as Examples 38 to 49. Table 24 shows the combination of the resin sheets used in each encapsulating sheet. Encapsulation is carried out in the same manner as Examples 11 to 16. A TAB type semiconductor chip having the size of 5 mm×15 mm×200 μm is used and the resultant package size is 8 mm×18 mm×450 μm. The thickness of the upper layer and the lower layer of the encapsulant is 125 μm, respectively. Further, the thickness ratio of a layer of each resin composition after curing is substantially the same before curing. Table 25 shows the combination of the resin sheets used in each example.

Example 50 is different from Comparative example 37 in the color of the outer surface of the device, i.e. white in Example 50 and black in Comparative example 37. Further, Example 50 is different from Comparative example 38 in the color at the chip surface, i.e. black in Example 50 and white in Comparative example 38. Also, Examples 54 to 58 are different from Comparative examples 39 to 42 in the color at the chip surface, i.e. black in Examples 54 to 58, and yellow, red, blue, and green in Comparative examples 39 to 42, respectively. Example 54 is different from Comparative example 37 in the colorant at the outer surface of the device, i.e. azo black organic dye in Example 54 and carbon black in Comparative example 37. Example 51 has a thinner white layer than Example 50. Also, Example 52 has a thinner white layer than Example 51, and Example 53 has a thinner white layer than Example 52.

Tables 26 to 28 show the following properties of each example:

(1) Moisture resistance after IR reflow soldering same as Examples 23 to 32

(2) Memory operating test

The chip of 4M DRAM is used and an occurrence of an error caused by irradiation of visible light from the active surface side is measured.

(3) Laser marking property

The device is irradiated with carbon oxide laser (energy density: 0.5 $J/cm^2$ at maximum) for 1/500,000 second through a mask. The marking is visually checked for contrast and evaluated as three grades such as "good"/"fair"/"poor". The color difference is also measured.

TABLE 23

| resin-composition No. | 41 | 42 | 43 | 44 | 45 | 46 | 47 | 48 | 49 | 50 |
|---|---|---|---|---|---|---|---|---|---|---|
| 1st epoxy resin (YX-4000H) | 8.5 | 8.5 | 8.5 | 8.5 | 8.5 | | | | | |
| 2nd epoxy resin (ESX-221) | | | | | | 11.0 | 11.0 | 11.0 | 11.0 | |
| 3rd epoxy resin (GY-260) | | | | | | | | | | 12.0 |
| 4th epoxy resin (ESCN-195XL) | 2.1 | 2.1 | 2.1 | 2.1 | 2.1 | | | | | |
| 5th epoxy resin (triglycidylisocyanurate) | 5.3 | 5.3 | 5.3 | 5.3 | 5.3 | | | | | |
| 1st phenol resin (BRL-556) | | | | | | 4.9 | 4.9 | 4.9 | 4.9 | |
| 2nd phenol resin (XL-225L) | | | | | | | | | | 48.0 |
| Acid anhydride (THPA) | | | | | | | | | | 38.0 |
| Silane coupling agent (A-187) | 0.5 | 0.5 | 0.5 | 0.5 | 0.5 | 0.5 | 0.5 | 0.5 | 0.5 | |
| 1st colorant (carbon black) | 0.3 | 0.2 | 0.1 | | | | | | | |
| 2nd colorant (titanium oxide) | | 0.1 | 0.2 | 0.3 | | | | | | |
| 3rd colorant (azo black dye) | | | | | 0.3 | | | | | |
| 4th colorant (cadmium yellow) | | | | | | 0.3 | | | | |
| 5th colorant (iron oxide red) | | | | | | | 0.3 | | | |
| 6th colorant (potassium ferrocyanide) | | | | | | | | 0.3 | | |
| 7th colorant (cobalt green) | | | | | | | | | 0.3 | |
| Curing accelerator (C17Z) | 0.4 | 0.4 | 0.4 | 0.4 | 0.4 | 0.4 | 0.4 | 0.4 | 0.4 | 2.0 |

TABLE 23-continued

| resin-composition No. | 41 | 42 | 43 | 44 | 45 | 46 | 47 | 48 | 49 | 50 |
|---|---|---|---|---|---|---|---|---|---|---|
| Silicone gel | 1.0 | 1.0 | 1.0 | 1.0 | 1.0 | 1.0 | 1.0 | 1.0 | 1.0 | |
| MBS resin | 1.5 | 1.5 | 1.5 | 1.5 | 1.5 | 1.5 | 1.5 | 1.5 | 1.5 | |
| Mold releasing agent | 0.4 | 0.4 | 0.4 | 0.4 | 0.4 | 0.4 | 0.4 | 0.4 | 0.4 | |
| Flame retardance (antimony trioxide) | 2.0 | 2.0 | 2.0 | 2.0 | 2.0 | 2.0 | 2.0 | 2.0 | 2.0 | |
| filler (GR-80AK) | 72.0 | 72.0 | 72.0 | 72.0 | 72.0 | 72.0 | 72.0 | 72.0 | 72.0 | |

TABLE 24

| Sheet 1 | Sheet 2 | Sheet 3 | Sheet 4 | Sheet 5 | Sheet 6 | Sheet 7 | Sheet 8 | Sheet 9 |
|---|---|---|---|---|---|---|---|---|
| resin composition 41 | resin composition 41 | resin composition 41 | resin composition 41 | resin composition 41 | resin composition 41 | resin composition 41 | resin composition 41 | resin composition 41 |
| 100 μm | 200 μm | 380 μm | 390 μm | 340 μm | 340 μm | 340 μm | 340 μm | 340 μm |
| resin composition 42 | resin composition 42 | resin composition 44 | resin composition 44 | resin composition 45 | resin composition 46 | resin composition 47 | resin composition 48 | resin composition 49 |
| 100 μm | 140 μm | 20 μm | 10 μm | 60 μm | 60 μm | 60 μm | 60 μm | 60 μm |
| 43 | 44 | | | | | | | |
| 100 μm | 60 μm | | | | | | | |
| 44 | | | | | | | | |
| 100 μm | | | | | | | | |

| Sheet 10 | Sheet 11 | sheet 12 | Sheet 13 | Sheet 14 | Sheet 15 |
|---|---|---|---|---|---|
| resin composition 41 | resin composition 44 | resin composition 46 | resin composition 47 | resin composition 48 | resin composition 49 |
| 400 μm | 400 μm | 400 μm | 400 μm | 400 μm | 400 μm |

TABLE 25

| | Example | | | | | | | | | Comparative Example | | | | | |
|---|---|---|---|---|---|---|---|---|---|---|---|---|---|---|---|
| | 50 | 51 | 52 | 53 | 54 | 55 | 56 | 57 | 58 | 37 | 38 | 39 | 40 | 41 | 42 |
| Active side | Sheet 1 | Sheet 2 | Sheet 3 | Sheet 4 | Sheet 5 | Sheet 6 | Sheet 7 | Sheet 8 | Sheet 9 | Sheet 10 | Sheet 11 | Sheet 12 | Sheet 13 | Sheet 14 | Sheet 15 |
| Bottom side | Sheet 1 | Sheet 2 | Sheet 3 | Sheet 4 | Sheet 5 | Sheet 6 | Sheet 7 | Sheet 8 | Sheet 9 | Sheet 10 | Sheet 11 | Sheet 12 | Sheet 13 | Sheet 14 | Sheet 15 |

TABLE 26

| | Example | | | | | | Comparative Example | |
|---|---|---|---|---|---|---|---|---|
| | 50 | 51 | 52 | 53 | 55 | 58 | 37 | 41 |
| Moisture resistance test after IR reflow soldering (Number of defectives/ number of samples) | | | | | | | | |
| Immediately after | 0/20 | 0/20 | 0/20 | 0/20 | 0/20 | 0/20 | 8/20 | 2/20 |
| 100 hours | 0/20 | 0/20 | 0/20 | 0/20 | 0/20 | 0/20 | 8/20 | 7/20 |
| 200 hours | 0/20 | 0/20 | 0/20 | 0/20 | 0/20 | 0/20 | 9/20 | 9/20 |
| 300 hours | 0/20 | 0/20 | 0/20 | 0/20 | 0/20 | 1/20 | 15/20 | 10/20 |
| 500 hours | 0/20 | 0/20 | 0/20 | 0/20 | 1/20 | 2/20 | 18/20 | 11/20 |
| 1000 hours | 0/20 | 0/20 | 0/20 | 1/20 | 2/20 | 3/20 | 19/20 | 12/20 |

TABLE 27

| | Example | | | | | | | | | | Comparative Example | | | | |
|---|---|---|---|---|---|---|---|---|---|---|---|---|---|---|---|
| | 50 | 51 | 52 | 53 | 54 | 55 | 56 | 57 | 58 | 37 | 38 | 39 | 40 | 41 | 42 |
| Test for operation of semiconductor device | o | o | o | o | o | o | o | o | o | o | x | x | x | x | x | o: No errors
x: Errors

TABLE 28

| | Example | | | | | | | | | | Comparative Example | | | | |
|---|---|---|---|---|---|---|---|---|---|---|---|---|---|---|---|
| | 50 | 51 | 52 | 53 | 54 | 55 | 56 | 57 | 58 | 37 | 38 | 39 | 40 | 41 | 42 |
| Laser marking contrast | Δ | O | O | O | O | O | O | Δ | O | x | x | x | x | x | x |
| Color difference (ΔE) | 27 | 35 | 39 | 44 | 43 | 34 | 32 | 30 | 33 | 10 | 14 | 15 | 13 | 11 | 12 | o: Good
Δ: Fair
X: Poor

Examples 50 to 53, 55, and 58 are superior to Comparative examples 37 and 41 in Moisture resistance after IR reflow soldering. Because Comparative example 37 and 41 are colored, the absorption of infrared rays is larger than these Examples. Examples 50 to 58 are superior to Comparative examples 38 to 42 in the memory operating test. Because these Comparative examples do not provide a black layer in the package, light can transmit through the package and causes erroneous operation. Examples 50 to 58 are superior to Comparative examples 37 to 42 in laser marking properties. Because Examples 50 to 58 provide a black layer under the white or other colored surface layer, the contrast and color difference is larger than these Comparative examples whose packages composed of a mono-colored layer.

Synthesis Example 7 of Resin Compositions

Resin compositions 51 to 65 are prepared from the following raw materials:

(1) an epoxy resin: ESX-221 (Sumitomo Chemical Co., Ltd.)
(2) a flame-retardant epoxy resin: AER-745 (Asahi Chemical Co., Ltd.)
(3) a phenol resin: XL-225L (Mitsui Toatsu Chemicals, Inc.)
(4) a silane coupling agent: A-187 (Nihon Unka K.K.)
(5) a first colorant: carbon black CB-30 (Mitsubishi Chemical Industries Ltd.)
(6) a second colorant: $TiO_2$
(7) a curing accelerator: C17Z (Shikoku Kasei Co., Ltd.)
(8) a silicone gel: thermosetting type adduct silicone gel
(9) a MBS resin: an average particle diameter of 30 μm
(10) a mold releasing agent: an ester wax
(11) a flame retardant: an antimony trioxide
(12) an inorganic filler: GR-80T (Toshiba Ceramics Co., Ltd.)

The resin compositions are made of the above-listed raw materials according to the ratio in parts by weight shown in Table 29 in the same manner as the synthesis example 1.

Examples 59 to 65 and Comparative Example 43

Encapsulating sheets are made of the above-mentioned resin compositions in the same manner as Examples 38 to 49. Table 30 shows the combination of the resin sheets used in each encapsulating sheet. Encapsulation is carried out in the same manner as Examples 11 to 16. A TAB type semiconductor chip having the size of 5 mm×15 mm×200 μm is used and the resultant package size is 8 mm×18 mm×450 μm. The thickness of the upper layer and the lower layer of the encapsulant is 125 μm, respectively. Further, the thickness ratio of a layer of each resin composition after curing is substantially the same before curing. Table 31 shows the combination of the resin sheets used in each example.

In Example 59, the amounts of the curing accelerator and the flame retardant at the mold side is larger than that of the chip side. In Example 60, the amounts of the curing accelerator and the inorganic filler at the mold side are larger than that at the chip side. In Example 61, the amounts of the flame retardant and the inorganic filler at the mold side are larger than that at the chip side. In Example 62, the amount of the curing accelerator at the mold side is larger than that at the chip side, and the surface of the mold side is white whereas that of the chip side is black. In Example 63, the amount of the flame retardant at the mold side is larger than that at the chip side, and the surface of the mold side is white whereas that of the chip side is black. In Example 64, the amount of the filler at the mold side is larger than that at the chip side, and the surface of the mold side is white whereas that of the chip side is black. In Example 65, the amounts of the curing accelerator the flame retardant, and the filler are larger than that at the chip side. In Comparative example 43, the amounts of these additives are the same at both of the chip and mold sides.

Table 32 shows the following properties of each example:

(1) Heat-shock resistance same as Examples 1 to 10;
(2) Moisture resistance same as Examples 1 to 10;
(3) Moisture resistance after IR reflow soldering same as Examples 23 to 32

TABLE 29

| resin: composition no. | 51 | 52 | 53 | 54 | 55 | 56 | 57 | 58 | 59 | 60 | 61 | 62 | 63 | 64 | 65 |
|---|---|---|---|---|---|---|---|---|---|---|---|---|---|---|---|
| epoxy resin (ESX-221) | 10.0 | 10.0 | 10.0 | 10.0 | 10.0 | 10.0 | 10.0 | 10.0 | 10.0 | 10.0 | 10.0 | 10.0 | 10.0 | 10.0 | 10.0 |
| Flame retardant epoxy resin (AER-745) | 4.0 | 4.0 | 4.0 | 4.0 | 4.0 | 4.0 | 4.0 | 4.0 | 4.0 | 4.0 | 4.0 | 4.0 | 4.0 | 4.0 | 4.0 |
| phenol: resin (XL-255L) | 7.9 | 7.9 | 7.9 | 7.9 | 7.9 | 7.9 | 7.9 | 7.9 | 7.9 | 7.9 | 7.9 | 7.9 | 7.9 | 7.9 | 7.9 |
| Silane coupling agent (A-187) | 0.5 | 0.5 | 0.5 | 0.5 | 0.5 | 0.5 | 0.5 | 0.5 | 0.5 | 0.5 | 0.5 | 0.5 | 0.5 | 0.5 | 0.5 |
| Silicone gel | 1.0 | 1.0 | 1.0 | 1.0 | 1.0 | 1.0 | 1.0 | 1.0 | 1.0 | 1.0 | 1.0 | 1.0 | 1.0 | 1.0 | 1.0 |
| MBS resin | 1.5 | 1.5 | 1.5 | 1.5 | 1.5 | 1.5 | 1.5 | 1.5 | 1.5 | 1.5 | 1.5 | 1.5 | 1.5 | 1.5 | 1.5 |
| Mold releasing agent | 0.4 | 0.4 | 0.4 | 0.4 | 0.4 | 0.4 | 0.4 | 0.4 | 0.4 | 0.4 | 0.4 | 0.4 | 0.4 | 0.4 | 0.4 |
| Curing accelerator (C17Z) | 0.4 | 0.6 | 0.2 | 0.6 | 0.2 | 0.4 | 0.4 | 0.6 | 0.2 | 0.4 | 0.4 | 0.4 | 0.4 | 0.6 | 0.2 |
| Flame retardant (antimony trioxide) | 2.0 | 3.0 | 1.0 | 2.0 | 2.0 | 3.0 | 1.0 | 2.0 | 2.0 | 3.0 | 1.0 | 2.0 | 2.0 | 3.0 | 1.0 |
| Clushed silica (GR-80T) | 72.0 | 72.0 | 72.0 | 80.0 | 65.0 | 80.0 | 65.0 | 72.0 | 72.0 | 72.0 | 72.0 | 80.0 | 65.0 | 80.0 | 65.0 |
| 1st colorant: (titanium oxide) | | | | | | | | 0.3 | | | 0.3 | | 0.3 | | |
| 2nd colorant: (carbon black) | 0.3 | 0.3 | 0.3 | 0.3 | 0.3 | 0.3 | 0.3 | | 0.3 | | 0.3 | | 0.3 | 0.3 | 0.3 |

TABLE 30

| Sheet | Sheet 1 | Sheet 2 | Sheet 3 | Sheet 4 | Sheet 5 | Sheet 6 | Sheet 7 | Sheet 8 |
|---|---|---|---|---|---|---|---|---|
| mold side | resin composition 51 400 μm | resin composition 52 200 μm | resin composition 54 200 μm | resin composition 56 200 μm | resin composition 58 200 μm | resin composition 60 200 μm | resin composition 62 200 μm | resin composition 64 200 μm |
| chip side | | resin composition 53 200 μm | resin composition 55 200 μm | resin composition 57 200 μm | resin composition 59 200 μm | resin composition 61 200 μm | resin composition 63 200 μm | resin composition 65 200 μm |

TABLE 31

| | Example 59 | Example 60 | Example 61 | Example 62 | Example 63 | Example 64 | Example 65 | Comparative Example 43 |
|---|---|---|---|---|---|---|---|---|
| Active Side | Sheet 2 | Sheet 3 | Sheet 4 | Sheet 5 | Sheet 6 | Sheet 7 | Sheet 8 | Sheet 1 |
| Bottom side | Sheet 2 | Sheet 3 | Sheet 4 | Sheet 5 | Sheet 6 | Sheet 7 | Sheet 8 | Sheet 1 |

TABLE 32

| | Example | | | | | | | Comparative Example |
|---|---|---|---|---|---|---|---|---|
| | 59 | 60 | 61 | 62 | 63 | 64 | 65 | 43 |
| TCT | | | | | | | | |
| 100 cycles | 0/20 | 0/20 | 0/20 | 0/20 | 0/20 | 0/20 | 0/20 | 1/20 |
| 200 cycles | 0/20 | 0/20 | 0/20 | 0/20 | 0/20 | 0/20 | 0/20 | 1/20 |
| 300 cycles | 0/20 | 0/20 | 0/20 | 0/20 | 0/20 | 0/20 | 0/20 | 2/20 |
| 500 cycles | 0/20 | 0/20 | 0/20 | 0/20 | 0/20 | 0/20 | 0/20 | 2/20 |
| 1000 cycles | 1/20 | 0/20 | 0/20 | 0/20 | 0/20 | 0/20 | 0/20 | 3/20 |
| PCT | | | | | | | | |
| 100 hours | 0/20 | 0/20 | 0/20 | 0/20 | 0/20 | 0/20 | 0/20 | 1/20 |
| 200 hours | 0/20 | 0/20 | 0/20 | 0/20 | 0/20 | 0/20 | 0/20 | 2/20 |
| 300 hours | 0/20 | 0/20 | 0/20 | 0/20 | 0/20 | 0/20 | 0/20 | 3/20 |
| 500 hours | 0/20 | 0/20 | 0/20 | 0/20 | 0/20 | 1/20 | 0/20 | 4/20 |
| 1000 hours | 0/20 | 1/20 | 0/20 | 1/20 | 1/20 | 2/20 | 0/20 | 5/20 |
| PCT after Soldering | | | | | | | | |
| Immediately after | 1/20 | 0/20 | 0/20 | 0/20 | 0/20 | 0/20 | 0/20 | 5/20 |
| 100 hours | 1/20 | 0/20 | 0/20 | 0/20 | 0/20 | 0/20 | 0/20 | 6/20 |
| 200 hours | 1/20 | 2/20 | 1/20 | 0/20 | 0/20 | 0/20 | 0/20 | 7/20 |
| 300 hours | 2/20 | 2/20 | 1/20 | 0/20 | 0/20 | 0/20 | 0/20 | 7/20 |
| 500 hours | 2/20 | 2/20 | 1/20 | 2/20 | 1/20 | 1/20 | 0/20 | 8/20 |
| 1000 hours | 2/20 | 3/20 | 2/20 | 2/20 | 1/20 | 2/20 | 0/20 | 9/20 |

Examples 59 to 65 are superior to Comparative examples 43 in each property. Because in these Examples, the amount of additives at the mold side is larger than that at the chip side, when it is effective that the additives exist at the surface of a device and it is harmful that the additives exist at the surface of a chip.

Example 66

Figure 9A:
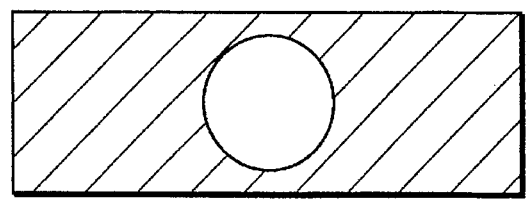
FIGS. 9(a) and 9(b) are plane views of an embodiment of the present invention.
Figure 9B:
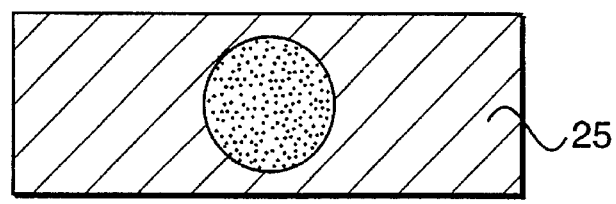
Figure 10A:
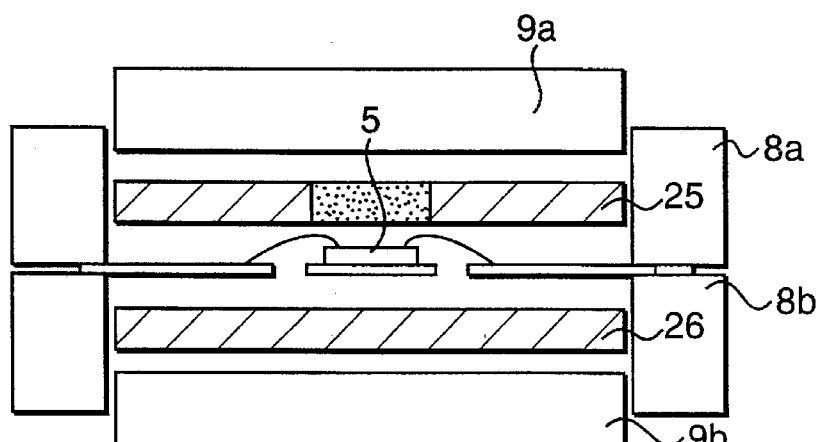
FIG. 10(a) is a schematic view of an apparatus for producing an embodiment of the present invention.
Figure 10B:
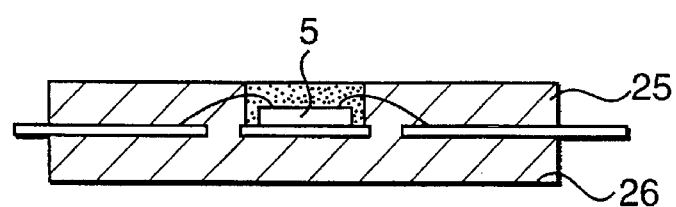

This example relates to encapsulation of an EPROM. The resin sheet of 35 mm×11 mm×500 μm is made of a resin composition No. 41 which is colored so as to screen a semiconductor chip from light. At the central portion of the resin sheet, a hole of 6 mm in diameter is formed by punching as shown in FIG. 9(a). The hole is filled with a transparent circular resin sheet of 5.5 µm in diameter and 500 µm in thickness. The transparent circular resin sheet is made of another resin composition, which does not contain a colorant so as to transmit erasing light, such as an UV ray. The resultant resin sheet is pressed with heating so as to be an encapsulating sheet 25 of 400 µm which has a window in a central portion as shown in FIG. 9(b). In the encapsulating sheet, the resin sheets are bonded and mixed at the interface. As shown in FIGS. 10(a) and (b), after the chip is positioned between the encapsulating sheet 25 at the active side of the chip and the encapsulating sheet 26 of 35 mm×11 mm×400 µm at the opposite side, encapsulation is carried out by pressing with heating. The resultant package size is 37 mm×12 mm×'740 µm. The above-mentioned process is easy to produce an EPROM by molding. Therefore, the productivity is improved. Since high temperature process such as used ceramics package, is not needed the damage to the semiconductor chip is reduced.

Synthesis Example 8 of Resin Compositions

Resin compositions 66 to 73 are prepared from the following raw materials:

(1) a first epoxy resin: YX-4000H (YuKa Shell Epoxy Co., Ltd.)

(2) a second epoxy resin: Epicoto 1001 (YuKa Shell Epoxy Co. Ltd.)

(3) a third epoxy resin: Epicoto 807 (YuKa Shell Epoxy Co., Ltd.)

(4) a fourth epoxy resin: ESX-221 (Sumitomo Chemical Co, Ltd.)

(5) a fifth epoxy resin: ESCN-195XL (Sumitomo Chemical Co. Ltd.)

(6) a phenol resin: BRL-556 (Showa Kobunshi Co., Ltd.)

(7) a silane coupling agent: A-187 (UCC)

(8) a colorant: carbon black CB-30 (Mitsubishi Chemical Industries Ltd.)

(9) a curing accelerator: C17Z (Shikoku Kasei Co., Ltd.)

(10) a silicone gel: thermosetting type adduct silicone gel

(11) a MBS resin: an average particle diameter of 30 µm

(12) a mold releasing agent: an ester wax

(13) an adhesiveness imparting agent: a Zr chelate

(14) a flame retardant: an antimony trioxide

(15) an inorganic filler: PK451 (Nihon Kagaku Kogyo K.K.)

The resin compositions are made of the above-listed raw materials according to the ratio in parts by weight shown in Table 33 in the same manner as the synthesis example 1. The particle size of the additives is 50 µm or less. The resin compositions Nos. 67, 69, and 71 contain the adhesiveness imparting agent. The resin composition No. 73 contains the mold releasing agent. The other compositions do not contain either the adhesiveness imparting agent or the mold releasing agent. Table 34 shows the adhesive strength with a polyimide film such as a passivation film, coated on a semiconductor chip by molding the resin compositions on the polyimide film. The sample of the resin composition 72 coated with the adhesiveness imparting agent and the sample of the resin composition 72 coated with the mold releasing agent are also listed.

TABLE 33

| | Resin Composition | | | | | | | |
|---|---|---|---|---|---|---|---|---|
| | 66 | 67 | 68 | 69 | 70 | 71 | 72 | 73 |
| 1st epoxy resin (YX-4000H) | 8.5 | 8.5 | | | | | | |
| 2nd epoxy resin (Epicote 101) | | | 13.5 | 13.5 | | | | |
| 3rd Epoxy Resin (Epicote 807) | | | | | 7.5 | 7.5 | | |
| 4th Epoxy Resin (ESX-221) | | | | | | | 9.5 | 9.5 |
| 5th Epoxy Resin (ESCN-195XL) | 2.1 | 2.1 | 1.1 | 1.1 | 2.1 | 2.1 | 2.1 | 2.1 |
| Phenol Resin (BRL-556) | 5.3 | 5.3 | 2.3 | 2.3 | 6.3 | 6.3 | 4.3 | 4.3 |
| Silane Coupling Agent (A-187) | 0.5 | 0.5 | 0.5 | 0.5 | 0.5 | 0.5 | 0.5 | 0.5 |
| Carbon Black (CB-30) | 0.3 | 0.3 | 0.3 | 0.3 | 0.3 | 0.3 | 0.3 | 0.3 |
| Curing Accelerator (C-17z) | 0.4 | 0.4 | 0.4 | 0.4 | 0.4 | 0.4 | 0.4 | 0.4 |
| Silicone Gel | 1.0 | 1.0 | 1.0 | 1.0 | 1.0 | 1.0 | 1.0 | 1.0 |
| MBS resin | 1.5 | 1.5 | 1.5 | 1.5 | 1.5 | 1.5 | 1.5 | 1.5 |
| Mold-Releasing Agent | | | | | | | | 0.2 |
| Adhesiveness Imparting Agent | | 0.2 | | 0.2 | | 0.2 | | |
| Flame retardant | 2.0 | 2.0 | 2.0 | 2.0 | 2.0 | 2.0 | 2.0 | 2.0 |
| Filler (PK451) | 78.0 | 78.0 | 78.0 | 78.0 | 78.0 | 78.0 | 78.0 | 78.0 |

TABLE 34

| resin composition No. | 66 | 67 | 68 | 69 | 70 | 71 | 72 | 73 | 72 | 72 |
|---|---|---|---|---|---|---|---|---|---|---|
| coated to the Surface | — | — | — | — | — | — | — | — | Ester Wax | Zr Chelate |
| Adhesive strength with Polyimide Passivation Film (kg/cm) | 4.3 | 5.1 | 5.2 | 6.3 | 4.8 | 5.7 | 2.1 | 1.3 | 1.7 | 2.8 |

Examples 67 to 76 and Comparative Examples 44 and 45

Figure 11:
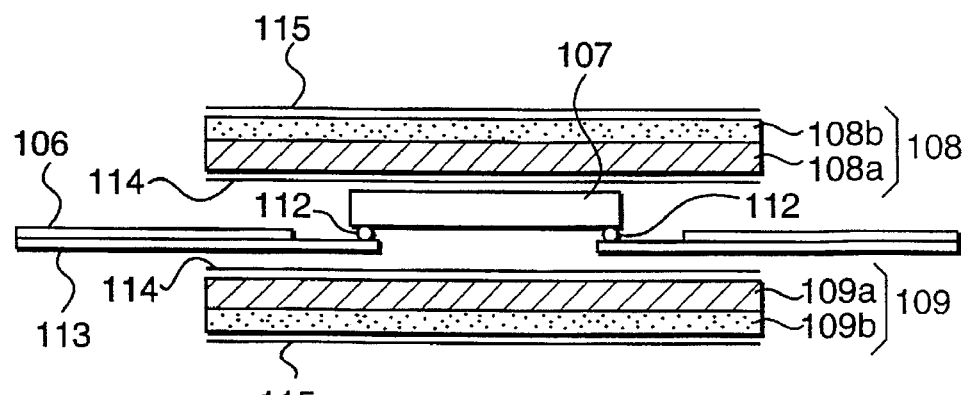
FIG. 10(b) is a cross-section of the product formed by the apparatus of FIG. 10(a) and FIG. 11 is a cross-sectional view of an embodiment of the present invention.

Table 35 shows the combination of the resin sheets used in each encapsulating sheet. A TAB type semiconductor chip is positioned between the resin sheets of 14 mm×14 mm. After that, encapsulation is carried out by pressing at 175° C. for 2 min. and thereafter post-curing at 180° C. for 8 h. so as to make a device of 15×15 mm in package size. In Examples 73 to 76, at least one of the adhesiveness imparting agent and the mold releasing agent is coated on the encapsulating sheets. In these Examples, a semiconductor chip 107, which is connected to leads 113 of film carrier 106 via bumps 112, is put between encapsulating sheets 108 and 109 as shown in FIG. 11. Endapsulating sheets 108 and 109 have a structure of a high adhesive resin sheet 108a, 109a and a low adhesive resin sheet 108b, 109b, respectively. The adhesiveness imparting agent 114 at a chip side or the mold releasing agent 115 at a mold side are coated on the encapsulating sheets in some Examples.

Table 36 shows the following properties of each example:
(1) Heat-shock resistance same as Examples 1 to 10;
(2) Moisture resistance same as Examples 1 to 10; and
(3) Soldering resistance same as Examples 1 to 10.

TABLE 35

|  | Example 67 | Example 68 | Example 69 | Example 70 | Example 71 | Example 72 | Example 73 | Example 74 | Example 75 | Example 76 | Comparative Example 44 | Comparative Example 45 |
|---|---|---|---|---|---|---|---|---|---|---|---|---|
| Active Surface Side Resin Sheet | | | | | | | | | | | | |
| Surface-coated Mold-releasing Agent | | | | | | | | | Ester Wax | | Ester Wax | |
| Mold Side (Thickness) | Composition 73 0.05 mm | Composition 73 0.05 mm | Composition 73 0.05 mm | Composition 73 0.06 mm | Composition 73 0.07 mm | Composition 73 0.08 mm | Composition 72 0.05 mm | Composition 73 0.05 mm | Composition 73 0.05 mm | Composition 72 0.05 mm | Composition 72 0.05 mm | Composition 73 0.05 mm |
| Chip Side (Thickness) | Composition 66 0.05 mm | Composition 67 0.05 mm | Composition 68 0.05 mm | Composition 69 0.04 mm | Composition 70 0.03 mm | Composition 71 0.02 mm | Composition 66 0.05 mm | Composition 67 0.05 mm | Composition 72 0.05 mm | Composition 72 0.05 mm | Composition 72 0.05 mm | Composition 73 0.05 mm |
| Surface-coated Adhesive Property Imparting Agent | | | | | | | | | Zr Chelate | Zr Chelate | | |
| Bottom Surface Side Resin Sheet | | | | | | | | | | | | |
| Surface-coated Adhesive Property Imparting Agent | | | | | | | | | Zr Chelate | Zr Chelate | | |
| Chip Side (Thickness) | Composition 66 0.25 mm | Composition 67 0.25 mm | Composition 68 0.25 mm | Composition 69 0.25 mm | Composition 70 0.20 mm | Composition 71 0.15 mm | Composition 66 0.25 mm | Composition 67 0.25 mm | Composition 72 0.25 mm | Composition 72 0.25 mm | Composition 72 0.25 mm | Composition 73 0.25 mm |
| Mold Side (Thickness) | Composition 73 0.25 mm | Composition 73 0.25 mm | Composition 73 0.25 mm | Composition 73 0.25 mm | Composition 73 0.30 mm | Composition 73 0.25 mm | Composition 72 0.25 mm | Composition 72 0.25 mm | Composition 73 0.25 mm | Composition 72 0.25 mm | Composition 72 0.25 mm | Composition 73 0.25 mm |
| Surface-coated Mold Releasing Agent | | | | | | | Ester Wax | Ester Wax | | Ester Wax | | |

TABLE 36

|  | Example | | | | | | | | | | Comparative Example | |
|---|---|---|---|---|---|---|---|---|---|---|---|---|
|  | 67 | 68 | 69 | 70 | 71 | 72 | 73 | 74 | 75 | 76 | 44 | 45 |
| TCT | | | | | | | | | | | | |
| 100 cycles | 0/20 | 0/20 | 0/20 | 0/20 | 0/20 | 0/20 | 0/20 | 0/20 | 0/20 | 0/20 | 0/20 | 0/20 |
| 200 cycles | 0/20 | 0/20 | 0/20 | 0/20 | 0/20 | 0/20 | 0/20 | 0/20 | 0/20 | 0/20 | 0/20 | 0/20 |
| 300 cycles | 0/20 | 0/20 | 0/20 | 0/20 | 0/20 | 0/20 | 0/20 | 0/20 | 1/20 | 0/20 | 0/20 | 3/20 |
| 500 cycles | 0/20 | 0/20 | 0/20 | 0/20 | 0/20 | 0/20 | 0/20 | 0/20 | 1/20 | 1/20 | 2/20 | 4/20 |
| 1000 cycles | 0/20 | 0/20 | 1/20 | 0/20 | 1/20 | 0/20 | 0/20 | 0/20 | 2/20 | 2/20 | 3/20 | 6/20 |
| PCT | | | | | | | | | | | | |
| 100 hours | 0/20 | 0/20 | 0/20 | 0/20 | 0/20 | 0/20 | 0/20 | 0/20 | 0/20 | 0/20 | 0/20 | 0/20 |
| 200 hours | 0/20 | 0/20 | 0/20 | 0/20 | 0/20 | 0/20 | 0/20 | 0/20 | 0/20 | 0/20 | 0/20 | 0/20 |
| 300 hours | 0/20 | 0/20 | 0/20 | 0/20 | 0/20 | 0/20 | 0/20 | 0/20 | 1/20 | 0/20 | 2/20 | 1/20 |
| 500 hours | 0/20 | 0/20 | 0/20 | 0/20 | 0/20 | 0/20 | 0/20 | 0/20 | 2/20 | 0/20 | 3/20 | 2/20 |
| 1000 hours | 0/20 | 0/20 | 0/20 | 0/20 | 0/20 | 1/20 | 0/20 | 0/20 | 2/20 | 1/20 | 3/20 | 2/20 |
| PCT after Soldering | | | | | | | | | | | | |
| Immediately after | 0/20 | 0/20 | 0/20 | 0/20 | 0/20 | 0/20 | 0/20 | 0/20 | 0/20 | 0/20 | 2/20 | 5/20 |
| 100 hours | 0/20 | 0/20 | 0/20 | 0/20 | 0/20 | 0/20 | 0/20 | 0/20 | 0/20 | 0/20 | 3/20 | 8/20 |
| 200 hours | 0/20 | 0/20 | 0/20 | 0/20 | 0/20 | 0/20 | 0/20 | 0/20 | 1/20 | 0/20 | 12/20 | 17/20 |
| 300 hours | 0/20 | 0/20 | 0/20 | 0/20 | 0/20 | 0/20 | 0/20 | 0/20 | 2/20 | 0/20 | 19/20 | 20/20 |
| 500 hours | 0/20 | 0/20 | 0/20 | 0/20 | 0/20 | 0/20 | 0/20 | 0/20 | 2/20 | 2/20 | 20/20 | |
| 1000 hours | 0/20 | 0/20 | 2/20 | 1/20 | 1/20 | 1/20 | 0/20 | 0/20 | 4/20 | 3/20 | | |

Examples 67 to 76 are superior to Comparative examples 44 and 45 in each property and the mold releasing property of these Examples is good. Because in these Examples, the adhesion strength between the cured resin and the chip is high whereas the adhesion strength between the cured resin and the mold is low, these properties, especially soldering resistance, can be improved without reducing the mold releasing property.

As mentioned above, the present invention provides the advantage of enhancing desirable properties associated with an additive, while reducing or eliminating undesirable properties associated with the additive by restricting the distribution of the additive to those regions where the properties are desirable while avoiding the distribution of the additive to those regions where the same properties are undesirable or where the additive introduces other undesirable properties. The above advantage may also be obtained by increasing the concentration of the additive in some regions and decreasing the concentration in other regions. Therefore, a plastic-encapsulated semiconductor device having the following properties can be obtained:

(1) good reliability and high thermal conductivity;

(2) high productivity and good reliability;

(3) good flame retardance and good reliability;

(4) high strength and good reliability;

(5) low cost and good reliability against $\alpha$-rays;

(6) good soldering resistance and good marking property;

(7) good moisture resistance and good reliability; or (8) good heat shock resistance and good reliability.

Obviously, numerous modifications and variations of the present invention are possible in light of the above teachings. It is therefore to be understood that within the scope of the appended claims, the invention may be practiced otherwise than as specifically described herein.

What is claimed is:

1. A resin-encapsulated semiconductor device comprising:

an encapsulating sheet on a semiconductor chip, the encapsulating sheet being initially comprised of an uncured resin sheet, and a distribution of a resin composition additive between one surface of the encapsulating sheet contacting the semiconductor chip and an opposite surface of the encapsulating sheet to improve a desired property where the additive exists without deteriorating another desired property at the opposite surface; the encapsulating sheet being cured in place on the semiconductor chip, wherein the distribution of an additive in the resin composition of the resin sheet is gradually varied from one of improving a desired property without deteriorating another desired property near the one surface of the encapsulating sheet contacting the semiconductor chip to one of improving a different desired property without deteriorating another different desired property near the opposite surface.

2. A resin-encapsulated semiconductor device comprising:

an encapsulating sheet on a semiconductor chip, the encapsulating sheet being initially comprised of an uncured resin sheet, and a distribution of a resin composition additive between one surface of the encapsulating sheet contacting the semiconductor chip and an opposite surface of the encapsulating sheet to improve a desired property where the additive exists without deteriorating another desired property at the opposite surface; the encapsulating sheet being cured in place on the semiconductor chip, wherein the distribution of the additive in the resin composition of the resin sheet differs between the one surface of the encapsulating sheet contacting the semiconductor chip and the opposite surface in at least one of the concentration and type of the additive, and wherein the encapsulating sheet comprises resin layers each having an additive distribution different from an adjacent layer in at least additive concentration for at least one type additive to provide a gradually varied distribution of the at least one type of additive between the one surface and the other surface of the resin sheet, the layers being bonded and mixed at an interface thereof.

3. A device according to claim 2, wherein the additive comprises at least one of a curing accelerator, a colorant, a mold releasing agent, an adhesion imparting agent, a flame retardant, and a filler.

4. A device according to claim 2, comprising a first encapsulating sheet on one side of the semiconductor chip and a second encapsulating sheet on another side of the semiconductor chip, and wherein the following relation is satisfied:

$$0.8 < (abc)/(def) < 1.2$$

where a: coefficient of thermal expansion of the first encapsulating sheet;

b: elastic modula of the first encapsulating sheet;

c: thickness of the first encapsulating sheet;

d: coefficient of thermal expansion of the second encapsulating sheet;

e: elastic modula of the second encapsulating sheet; and f: thickness of the second encapsulating sheet.

5. A device according to claim 2, wherein the additive distributions are such that the following condition in relation to semiconductor warpage is satisfied:

$$((L'-L)/L) < 0.06$$

where

L: thickness of the semiconductor device; and

L': the maximum height of the semiconductor device measured from a flat surface.

6. A resin-encapsulated semiconductor device comprising:

a resin-encapsulating sheet of resin layers each having an unique distribution of a resin composition additive to improve a desired property in the resin-encapsulating sheet at an inner surface thereof without deteriorating another desired property at the opposite outer surface of the of the resin-encapsulating sheet due to presence of the same additive at the outer surface, wherein the distribution of the resin composition additive varies gradually between the inner surface of the resin-encapsulating sheet and the opposite outer surface thereof, and wherein the additive comprises at least one of additive types including a curing accelerator, a colorant, a mold releasing agent, an adhesion imparting agent, a flame retardant, and a filler; and a semiconductor chip encapsulated by surface contact with the inner surface of the resin-encapsulating sheet.

7. A device according to claim 6, wherein the distribution of the resin composition additive at the inner surface of the resin-encapsulating sheet in contact with the semiconductor chip differs from additive distribution at the opposite outer surface in concentration of at least one type of additive.

8. A device according to claim 6, wherein the resin-encapsulating sheet comprises resin layers each having a resin composition additive differing from the other layers in concentration of at least one type of the additive, said resin layers being bonded and mixed at an interface thereof.

9. A device according to claim 6, wherein the resin layers are of substantially the same resin composition so as to be bonded and mixed at an interface thereof.

10. A device according to claim 6, wherein concentration of at least one of the mold releasing agent, the flame retardant, the filler, and the curing accelerator at the inner surface of the resin-encapsulating sheet contacting to the semiconductor chip is smaller than that at the outer surface.

11. A device according to claim 6, wherein the resin composition additive is a filler, the average diameter of the filler at the inner surface of the resin-encapsulating sheet contacting the semiconductor chip being smaller than that at the outer surface.

12. A device according to claim 6, wherein the resin composition additive is a filler having at least one of a crushed shape, a flake shape, and a fiber shape, the filler concentration at the inner surface of the resin-encapsulating sheet contacting the semiconductor chip being smaller than that at the outer surface.

13. A device according to claim 6, wherein the resin composition additive is a filler, a concentration of at least one of U and Th in the filler at the inner surface of the resin-encapsulating sheet contacting the semiconductor chip being smaller than that at the outer surface.

14. A device according to claim 6, wherein the additive is an adhesion imparting agent having a concentration at the inner surface of the resin-encapsulating sheet contacting the semiconductor chip larger than that at the outer surface.

15. A device according to claim 6, wherein said resin encapsulating sheet is a first resin-encapsulating sheet on an upper side of the semiconductor chip and comprisinq a second resin-encapsulating sheet on the lower side of the semiconductor chip, and wherein the additive distributions are in ranges where the following relation is satisfied:

$$0.8 < (abc)/(def) < 1.2$$

where
- a: coefficient of thermal expansion of the first resin-encapsulating sheet;
- b: elastic modula of the first resin-encapsulating sheet;
- c: thickness of the first resin-encapsulating sheet;
- d: coefficient of thermal expansion of the second resin-encapsulating sheet;
- e: elastic modula of the second resin-encapsulating sheet; and
- f: thickness of the second resin-encapsulating sheet.

16. A device according to claim 6, wherein the additive distributions are selected so that the following condition in relation to semiconductor warpage is satisfied:

$$\{(L'-L)/L\} < 0.06$$

where
- L: thickness of the semiconductor device; and
- L': the maximum height of the semiconductor device measured from a flat surface.

17. A resin-encapsulated semiconductor device comprising:
- a semiconductor chip;
- a first resin-encapsulating sheet formed on an upper side of the semiconductor chip; and
- a second resin-encapsulating sheet formed on a lower side of the semiconductor chip, the first and second resin-encapsulating sheets having different distribution of resin composition additive so that the following condition in relation to semiconductor warpage is satisfied:

$$\{(L'-L)/L\} < 0.06$$

where
- L: thickness of the semiconductor device; and
- L': the maximum height of the semiconductor device measured from a flat surface.

18. A resin-encapsulated semiconductor device comprising:
- a semiconductor chip;
- a first resin-encapsulating sheet formed on an upper side of the semiconductor chip; and
- a second resin-encapsulating sheet formed on a lower side of the semiconductor chip, the first and second resin-encapsulating sheets having different additive distribution and wherein the following relation of first and second resin-encapsulating sheet characteristics is maintained:

$$0.8 < (abc)/(def) < 1.2$$

where
- a: coefficient of thermal expansion of the first resin-encapsulating sheet;
- b: elastic modula of the first resin-encapsulating sheet;
- c: thickness of the first resin-encapsulating sheet;
- d: coefficient of thermal expansion of the second resin-encapsulating sheet;
- e: elastic modula of the second resin-encapsulating sheet; and
- f: thickness of the second resin-encapsulating sheet.

19. A device according to claim 18, wherein the following condition in relation to semiconductor warpage is also satisfied:

$$\{(L'-L)/L\} < 0.06$$

- L: thickness of the semiconductor device; and
- L': the maximum height of the semiconductor device measured from a flat surface.

20. An encapsulating sheet for encapsulating a semiconductor device when placed on the semiconductor chip, and cured, the encapsulating sheet comprising:
- an uncured resin sheet having a resin composition additive of a distribution different between one surface of the encapsulating sheet contacting the semiconductor and an opposite surface, and the additive comprises at least one of curing accelerator, a colorant, a mold releasing agent, an adhesion imparting agent, a flame retardant, and a filler.

* * * * *